(12) United States Patent
Bellows et al.

(10) Patent No.: US 7,613,883 B2
(45) Date of Patent: Nov. 3, 2009

(54) MEMORY DEVICE WITH MODE-SELECTABLE PREFETCH AND CLOCK-TO-CORE TIMING

(75) Inventors: Chad A. Bellows, Burlingame, CA (US); Craig E. Hampel, Los Altos, CA (US)

(73) Assignee: Rambus Inc., Los Altos, CA (US)

( * ) Notice: Subject to any disclaimer, the term of this patent is extended or adjusted under 35 U.S.C. 154(b) by 246 days.

(21) Appl. No.: 11/373,394

(22) Filed: Mar. 10, 2006

(65) Prior Publication Data

US 2007/0214335 A1    Sep. 13, 2007

(51) Int. Cl.
G06F 13/00 (2006.01)
G06F 13/28 (2006.01)

(52) U.S. Cl. .................. 711/137; 711/105; 711/167; 365/222

(58) Field of Classification Search .......... 711/137, 711/105, 167
See application file for complete search history.

(56) References Cited

U.S. PATENT DOCUMENTS

| | | | |
|---|---|---|---|
| 5,329,489 | A | 7/1994 | Diefendorff |
| 5,521,878 | A | 5/1996 | Ohtani |
| 5,778,436 | A | 7/1998 | Kedem et al. |
| 6,240,047 | B1 * | 5/2001 | Koelling et al. ........ 365/233.14 |
| 2004/0260884 | A1 * | 12/2004 | Poznanovic et al. ......... 711/137 |
| 2006/0039227 | A1 | 2/2006 | Lai et al. |
| 2006/0112231 | A1 * | 5/2006 | Ryan et al. .................. 711/137 |

FOREIGN PATENT DOCUMENTS

WO    WO01/16954    3/2001

OTHER PUBLICATIONS

International Search Report and Written Opinion for PCT/US2007/063567, European Patent Office, Dec. 11, 2007, 16 pgs.
The International Bureau of WIPO, Geneva, Switzerland, "International Preliminary Report on Patentability," Sep. 16, 2008, 8 pages.

* cited by examiner

*Primary Examiner*—Matt Kim
*Assistant Examiner*—Edward J Dudek
(74) *Attorney, Agent, or Firm*—Mahamedi Paradice Kreisman LLP

(57) ABSTRACT

In a memory device, either a first portion or a second, smaller portion of data retrieved from a storage array is loaded into a data buffer in accordance with a prefetch mode selection and then output from the memory device via a signaling interface. A value that indicates a minimum number of cycles of a clock signal that are to transpire between successive accesses to any one of the storage resources may be received and stored within a configuration circuit of the memory device. If the value indicates a number of clock cycles, N, that is less than a threshold number, the memory device may transfer data associated with a first address between the signaling interface and the data buffer during each of N cycles of the clock signal. If N is greater than or equal to the threshold number, the memory device may transfer the data associated with the first address between the signaling interface and the storage buffer during each of X cycles of the clock signal, and then transfer data associated with the second address between the signaling interface and the storage buffer during each of X cycles of the clock signal, where X is an integer value less than N.

9 Claims, 11 Drawing Sheets

| PM | SPA[1] | SPA[0] | S15 | S14 | S13 | S12 | S11 | S10 | S9 | S8 | S7 | S6 | S5 | S4 | S3 | S2 | S1 | S0 |
|----|--------|--------|-----|-----|-----|-----|-----|-----|----|----|----|----|----|----|----|----|----|----|
| x16 | X | X | d15 | d14 | d13 | d12 | d11 | d10 | d9 | d8 | d7 | d6 | d5 | d4 | d3 | d2 | d1 | d0 |
| x8  | 0 | X | -   | -   | -   | -   | -   | -   | d9 | d8 | d7 | d6 | d5 | d4 | d3 | d2 | d1 | d0 |
| x8  | 1 | X | -   | -   | -   | -   | d15 | d14 | d13| d12| d7 | d6 | d5 | d4 | d3 | d2 | d1 | d0 |
| x4  | 0 | 0 | -   | -   | -   | -   | -   | -   | d9 | d8 | -  | -  | -  | -  | d3 | d2 | d1 | d0 |
| x4  | 0 | 1 | -   | -   | -   | -   | -   | -   | d11| d10| -  | -  | -  | -  | d3 | d2 | d1 | d0 |
| x4  | 1 | 0 | -   | -   | -   | -   | -   | -   | d13| d12| -  | -  | -  | -  | d7 | d6 | d5 | d4 |
| x4  | 1 | 1 | -   | -   | -   | -   | -   | -   | d15| d14| -  | -  | -  | -  | d7 | d6 | d5 | d4 |

FIG. 3

| PM | LC | S15 | S14 | S13 | S12 | S11 | S10 | S9 | S8 | S7 | S6 | S5 | S4 | S3 | S2 | S1 | S0 |
|----|----|-----|-----|-----|-----|-----|-----|----|----|----|----|----|----|----|----|----|----|
| x16 | Load  | L | L | L | L | L | L | L | L | L | L | L | L | L | L | L | L |
| x16 | Shift | H | S | S | S | S | S | S | S | S | S | S | S | S | S | S | S |
| x16 | Hold  | H | H | H | H | H | H | H | H | H | H | H | H | H | H | H | H |
| x8  | Load  | H | H | H | H | H | H | H | H | L | L | L | L | L | L | L | L |
| x8  | Shift | H | H | H | H | H | H | H | H | H | S | S | S | S | S | S | S |
| x8  | Hold  | H | H | H | H | H | H | H | H | H | H | H | H | H | H | H | H |
| x4  | Load  | H | H | H | H | H | H | H | H | H | H | H | H | L | L | L | L |
| x4  | Hold  | H | H | H | H | H | H | H | H | H | H | H | H | H | H | H | H |

FIG. 4

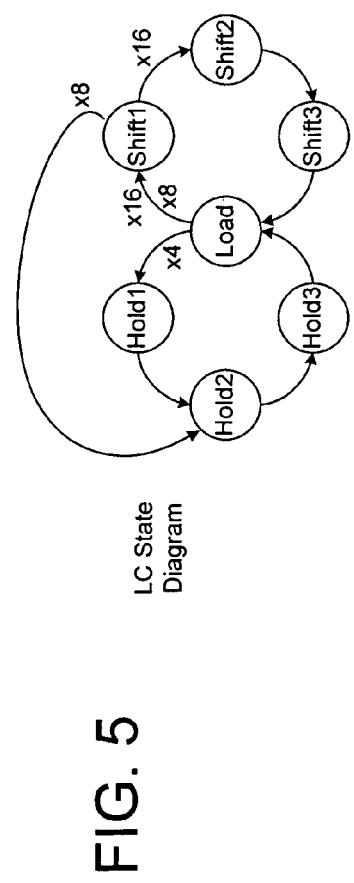

FIG. 5
LC State Diagram

| ce | PM | SPA[1] | SPA[0] | a | b | c | d |
|---|---|---|---|---|---|---|---|
| 0 | X | X | X | 0 | 0 | 0 | 0 |
| 1 | x16 | X | X | 1 | 1 | 1 | 1 |
| 1 | x8 | 0 | X | 1 | 1 | 0 | 0 |
| 1 | x8 | 1 | X | 0 | 0 | 1 | 1 |
| 1 | x4 | 0 | 0 | 1 | 0 | 0 | 0 |
| 1 | x4 | 0 | 1 | 0 | 1 | 0 | 0 |
| 1 | x4 | 1 | 0 | 0 | 0 | 1 | 0 |
| 1 | x4 | 1 | 1 | 0 | 0 | 0 | 1 |

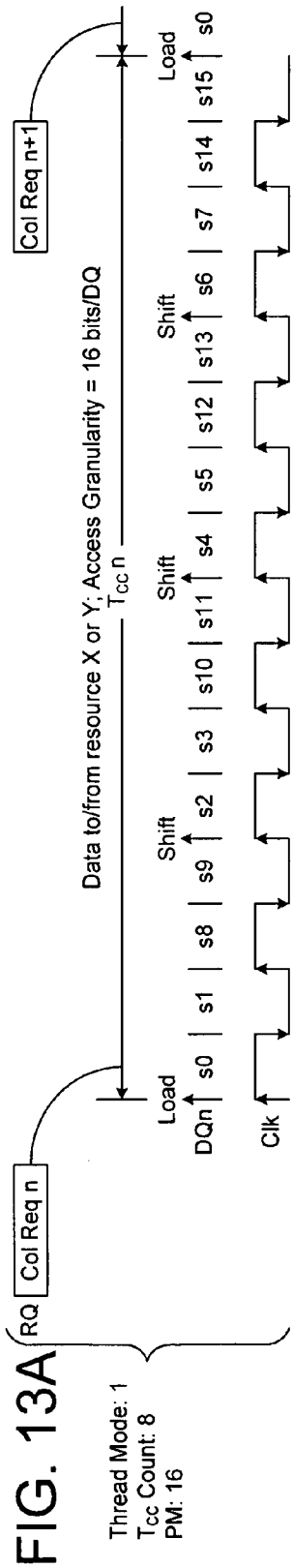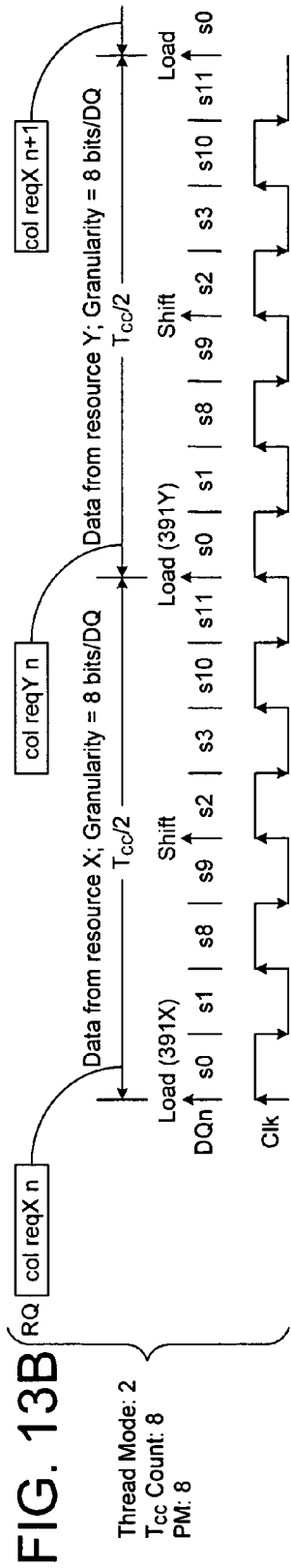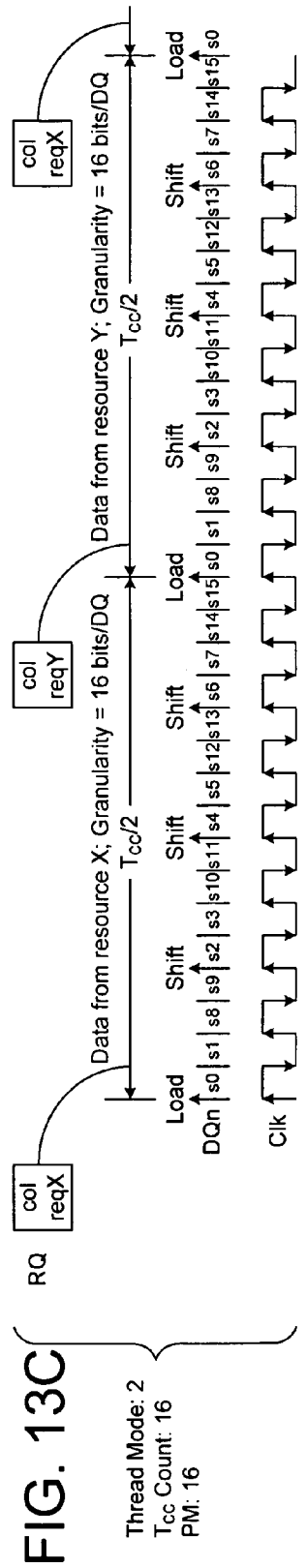

MEMORY DEVICE WITH MODE-SELECTABLE PREFETCH AND CLOCK-TO-CORE TIMING

FIELD OF THE INVENTION

The present invention relates to integrated circuits, data processing and data storage within a data processing system.

BACKGROUND

Signaling rate advances continue to outpace core access time improvement in dynamic random access memories (DRAMs), leading to device architectures that prefetch ever larger amounts of data from the core to meet peak data transfer rates. The trend in a number of data processing applications, however, is toward finer-grained memory access so that prefetching large quantities of data to in an effort to reach peak data transfer rates may result in retrieval of a substantial amount of unneeded data, wasting power and increasing thermal loading. Although DRAM architectures that output only a selected portion of prefetched data have been proposed, such architectures generally prefetch an amount of data that corresponds to the maximum prefetch size, completely filling a data buffer in the prefetch operation, then outputting only a portion of the buffered data. Consequently, a substantial quantity of non-requested data may be retrieved from the core and stored in the data buffer of such selectable-output-size devices, thus needlessly consuming power and increasing thermal loading.

In addition, as costs of producing successive generations of semiconductor devices escalate, it becomes increasing desirable to extend the operating frequency range of the current device generation. Unfortunately, increasing the operating frequency range for data transfers puts stress on the core access times to keep pace. Consequently, solutions that meet a wide data transfer range without over-stressing the core speed are highly desirable.

BRIEF DESCRIPTION OF THE DRAWINGS

The present invention is illustrated by way of example, and not by way of limitation, in the figures of the accompanying drawings and in which like reference numerals refer to similar elements and in which:

FIG. 3 illustrates selections made within the data-selecting multiplexers of FIG. 2 in response to the control signals supplied to the load control logic of FIG. 2;

FIG. 4 illustrates selections made within the load-control multiplexers of FIG. 2 in response to the control signals supplied to the load control logic of FIG. 2;

FIG. 5 illustrates an exemplary load-control state diagram, implemented, for example, by state machine circuitry within the request logic of FIG. 1;

FIGS. 13A-13C illustrate request and data transfer operations in the different memory access modes of FIGS. 12A-12C.

DETAILED DESCRIPTION

Figure 1:
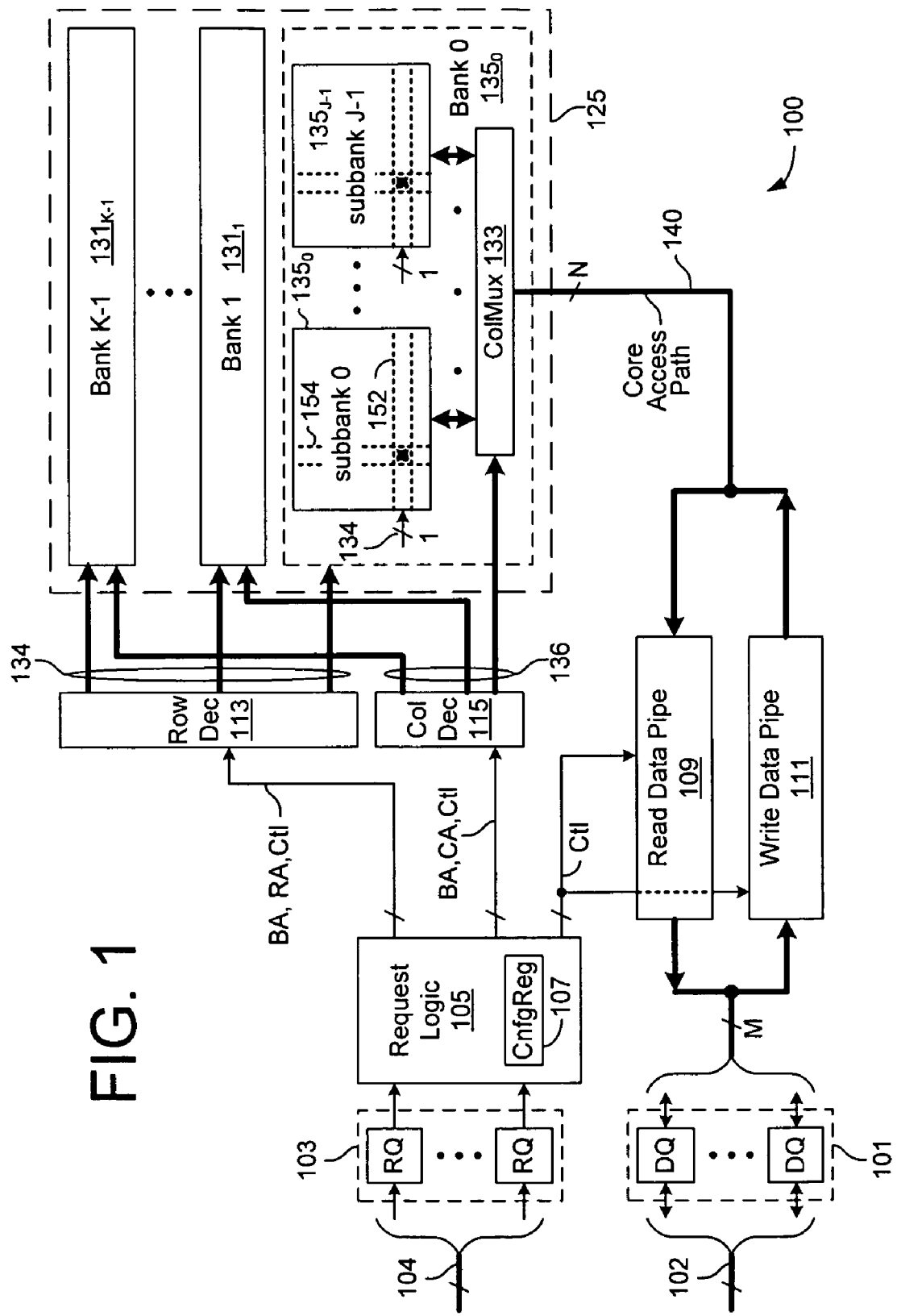
FIG. 1 illustrates an embodiment of a memory device having circuitry to support scaled prefetch modes, including a full prefetch mode and at least one partial prefetch mode.

A memory device having circuitry to support scaled prefetch modes is disclosed in various embodiments. In one embodiment, the prefetch modes include a full prefetch mode in which an amount of data that corresponds to a maximum prefetch size is retrieved from the memory core and stored in a read data buffer before being transmitted, and one or more partial prefetch modes in which an amount of data that corresponds to a fraction of the maximum prefetch size is retrieved from the memory core and stored in the read data buffer before transmission. Because a reduced amount of data is transferred from the memory core to the read data buffer in a partial prefetch mode (i.e., as compared to the full amount data transferred in the full prefetch mode), selected signal lines within the internal data path between the memory core and the read data buffer need not be driven and selected storage elements within the read data buffer need not be loaded. Accordingly, by driving only that subset of the signal lines within the internal data path needed to convey the reduced amount of prefetch data, and/or by loading only the subset of storage elements within the read data buffer needed to store the reduced amount of prefetch data, substantial power savings may be realized. Further power may be saved during write operations by driving only a subset of the signal lines of the internal data path with write data. Also, in an embodiment having scaled or fixed prefetch modes, the relative timing between a clock signal used to time data transmit and/or receive operations (or otherwise control operations within the memory device) and the minimum time between successive accesses to the same storage resource within the memory core may be specified by a configuration register value, thus establishing a corresponding determination of the number of memory core resources that may be accessed in each core cycle time. For example, in one embodiment, if the configuration register value specifies more than a threshold number of clock cycles per core cycle time, the memory device operates in a mode in which two or more resources within the memory core are independently addressed and accessed during each core cycle time to ensure that sufficient data is retrieved from (or written to the core) to keep pace with the peak signaling bandwidth afforded by the clock rate. If the configuration register value specifies fewer than the threshold number of clock cycles per core cycle time (a lower clock rate), the memory device operates in a mode in which a single core access is performed during each core cycle time. With regard to the prefetch mode selections and specification of the clock-to-core ratio (i.e., clock cycles per core cycle time), an internal configuration register may be run-time or production-time programmed to establish the desired settings. Alternatively, input signals that are, for example, strapped to supply or ground reference voltages or supplied by a control device, may be used to control the prefetch data size and/or to specify the clock-to-core ratio.

FIG. 1 illustrates an embodiment of a memory device 100 having circuitry to support scaled prefetch modes, including a full prefetch mode and at least one partial prefetch mode. In the particular embodiment shown, and other embodiments disclosed herein, the memory device 100 is a dynamic random access memory (DRAM) device that includes, among its component circuit blocks, a data interface 101, request interface 103, request logic 105, read and write data pipes 109 and 111, row and column decoders 113 and 115, and memory core 125. In alternative embodiments, the memory device 100 may be any other type of memory device that may benefit from scaled prefetch operation.

The request interface 103 is coupled to receive memory access requests and configuration requests from a memory controller or other control device via external request path 104, and the data interface 101 is coupled to receive write data from the memory controller and transmit read data to the memory controller via external data path 102. In one embodiment, the request interface 103 is a unidirectional synchronous interface that includes a bank of sampling circuits to sample incoming request signals in response to one or more timing signals (e.g., clock signals or strobe signals conveyed on separate signal lines or recovered from the data or request signals using clock-data recovery techniques), thereby recovering multi-bit requests that are passed to the request logic 105. The data interface 101 is a bidirectional synchronous interface having sampling circuits to sample incoming write data signals (or other information) in response to one or more timing signals as well as output driver circuits to transmit read data signals in response to a transmit clock signal or strobe signal. In an alternative embodiment, separate unidirectional interfaces may be provided for receipt of write data and transmission of read data, and/or the request interface 103 may be bidirectional, for example, to enable requests to be acknowledged or to allow the memory device 100 to initiate requests to the memory controller. Also, request signals and/or data signals may be conveyed between the memory controller and memory device 100 asynchronously in alternative embodiments. The external signal paths 102, 104 may each be implemented by single-ended or differential point-to-point signaling links and/or multi-drop signaling links.

In one embodiment, each incoming request is received in a sequence of transfers over the request path 104, with the individual time slices of the request being accumulated within the request logic 105 until the entire request is received (alternatively, if the request path is wide enough, all the bits of a request may be received in a single transfer over the request path) and includes an operation code which indicates the nature of the requested operation (e.g., row activation, column read, column write, precharge, register write, refresh, etc.) and, in the case of a memory access request, one or more address values that specify the row and/or column to be accessed within the memory core 125. Alternatively, the one or more addresses or any of them may be conveyed in time-multiplexed fashion over the external data path 102 or via a dedicated address signal path.

The request logic 105 decodes the incoming requests and issues control and timing signals to other circuit blocks within the memory device 100 to carry out the requested operation, including issuing row address, bank address and control information (RA, BA, Ctl) to the row decoder 113 in response to a row activation request, and column address, bank address and control information (CA, BA, Ctl) to the column decoder 115 and load control information to the read data pipe 109 and write data pipe 111 in response to column access requests. The information provided to the decoders 113, 115 and data pipes 109, 111 may indicate one of a number of different prefetch modes, including the full prefetch mode and partial prefetch mode discussed above. The prefetch-mode-dependent operation of the row and column decoders 113, 115 and read and write data pipes 109, 111 is discussed in further detail below. As shown, the request logic 105 may include one or more configuration circuits 107 implemented, for example, by a programmable configuration register or other volatile circuitry, or by non-volatile circuitry such as a one-time-programmable elements (e.g., fuse-controlled logic), floating-gate devices or any other nonvolatile storage). In one embodiment, the prefetch mode of the memory device 100 is controlled through programming (i.e., storing in response to a host instruction) a prefetch mode value in the configuration circuit 107, thus effecting a selection of one of multiple possible prefetch modes, including a full prefetch mode and one or more partial prefetch modes. Note that the configuration circuit may be separate from the request logic 105 in alternative embodiments. Also, instead of establishing the prefetch mode through programming a configuration circuit 107, the prefetch mode may be controlled via the state of signals received via the request interface 103, data interface 101 or another interface. For example, in one embodiment, a set of prefetch signal inputs (or at least one signal input) is provided to receive a prefetch mode signal that is used to control the prefetch mode within the memory device 100. The prefetch signal inputs may be strapped to logic levels (e.g., tied high and/or low by interconnections between the memory device 100 and circuit-board or chip-package ground and supply voltage lines) or may be received from another integrated circuit device.

In the particular embodiment shown in FIG. 1, the memory core 125 includes a storage array formed by multiple (K) independently addressable banks of storage cells, $131_0$-$131_{K-1}$, each of which includes multiple (J) subbanks $135_0$-$135_{j-1}$. Each of the subbanks 135 includes storage cells arranged in rows 152 and columns 154, with word lines 134 coupled to each row of storage cells and bit lines (not shown) coupled to each column of storage cells. Each subbank 135 additionally includes a set of sense amplifiers (not shown in FIG. 1) coupled to the bit lines, the set of sense amplifiers for each bank (131) of storage cells constituting a sense amplifier bank. Note that the sense amplifiers may be viewed as an entity separate from the subbanks 135, banks 131 or memory core 125.

During a row activation operation, initiated in response to a row activation request, the request logic 105 provides a bank address (BA) and row address (RA), received with or in association with the request, to the row decoder 113 and asserts a decode-enable signal (i.e., part of the control information, Ctl) to enable a row decoding operation therein. The row decoder 113 responds to the decode-enable signal by decoding the bank address to select one of the K banks (131) of storage cells for row activation, and decoding the row address to activate the row-address-specified one of the word lines 134 within the selected bank 131. Word line activation enables the contents of the corresponding row of storage cells (i.e., the storage cells coupled to the activated word line) to drive the bit lines within each of the subbanks 135 of the address-selected bank 131. Simultaneously with word line activation, or after a period of time sufficient to enable the stored data to appear on the bit lines, the row decoder 113 also activates a sense-enable line to enable the contents of the address-selected row to be captured within the sense amplifiers of the address-selected bank 131, thus concluding the row activation operation. In one embodiment, the word lines 134 for each bank 131 are composed of word line segments that extend across respective subrows of storage cells within each subbank 135 of the address-selected bank 131, and the sense enable line for each bank 131 is similarly segmented across the subbanks. In such an embodiment, a row activation operation may involve activation of each of the word line segments and sense-enable line segments (or a subset thereof) to enable capture of the output data in the sense amplifiers of each subbank $135_0$-$135_{J-1}$ of the selected bank 131. It should be noted that the subbanks $135_0$-$135_{J-1}$ may be oriented in various alternative positions relative to each other, for example, to simplify signal routing and/or reduce switching noise.

Once a storage row has been activated (i.e., content of the row of storage cells transferred to the corresponding set of sense amplifiers), column access operations may be directed to the activated row to read and write data at selected column locations within the sense amplifiers of an address-selected bank. In a memory read operation, for example, a bank address and a column address are supplied to the column decoder 115 along with a decode-enable signal (i.e., part of the control information, Ctl). When the decode-enable signal is asserted, the column decoder 115 switchably connects, via signal lines 136 coupled to column multiplexer 133 (ColMux), data nodes within an address-selected column of sense amplifiers (within a bank 131 selected by the bank address) to core access path 140 (i.e., an internal data path of the memory device), thus enabling a selected column of read data within the activated row to be transferred to the read data pipe 109. In one embodiment, a predetermined period of time after asserting the column-decode enable signal (i.e., a time sufficient for the read data to become valid on core access path 140 at the input of the read data pipe 109), the request logic 105 issues a load signal to the read data pipe 109 to enable data to be loaded from the core access path 140 into the read data pipe 109. Thereafter, the read data is shifted out of the read data pipe 109 to the data interface 101 and transmitted to the memory controller via the external data path 102. After a sequence of column reads (or at least one column read) directed to respective columns of the activated row have been completed, a precharge operation is performed to prepare the sense amplifier bank and corresponding bit lines for a subsequent row activation operation.

In a memory write operation, the data flow direction is reversed. Write data is received in the data interface 101 via the external data path 102, and shifted into the write data pipe 111 in response to load timing signals from the request logic 105. Within the write data pipe 111, the write data is deserialized (i.e., converted into a more parallel bit format) and driven onto the core access path 140. Write masking information, received via the data interface or other signaling path (e.g., with the request), may be used to indicate specific bytes or other data units within the overall set of incoming write data that are to be written, with all other data units being masked (i.e., not written). As in the data read operation, the column decoder 115 switchably-connects, via multiplexer 133, signal lines of the core access path 140 to an addressselected column of the sense amplifiers, enabling the write data to be captured (i.e., stored) in the data nodes of the column sense amplifiers and thus effecting the column write operation. After a sequence of column write operations (or at least one write operation) directed to respective columns of the activated row have been completed, a precharge operation is performed to transfer (or conclude transference of) the contents of the sense amplifier bank to the storage cells of the activated row and to prepare the sense amplifier bank and corresponding bit lines for a subsequent row activation operation.

In one embodiment, the number of sense amplifiers accessed in a column access operation (i.e., a read or write operation) is determined according to the prefetch mode and may range from a full column of sense amplifiers, when a full prefetch mode is selected, to one or more fractions of a full column of sense amplifiers when one or more partial prefetch modes are selected. More specifically, during a column access operation in full prefetch mode, each signal line within the core access path is switchably connected via column multiplexer 133 of the address-selected bank to the data node of a respective sense amplifier within the address-selected bank, and in a partial prefetch mode, only a fraction (i.e., a subset or less than all) of the signal lines that form the core access path 140 are switchably connected to the data nodes of respective sense amplifiers. By this operation, the relatively high-capacitance signal lines that form the core access path 140 (i.e., the core access signal lines) are driven only when needed to convey read data that will be output from the memory device 100 or to convey write data that will be stored within the memory core 125, thus saving substantial power in partial prefetch modes as compared with implementations that retrieve a full-prefetch data amount from the memory core in each memory read, but then output only a subset of the prefetch data from the memory device.

Still referring to FIG. 1, further power savings are realized in partial prefetch modes by enabling data capture within only that subset of storage elements within the read data pipe 109 necessary to store the partial prefetch data. In one embodiment, for example, multiplexing circuitry is provided within the read data pipe 109 to switchably connect an addressselected subset of the core access signal lines to input nodes of a subset of the storage elements that form the data storage buffer of the read data pipe 109. When read data becomes valid on the subset of core access signal lines, a load operation is triggered within only the corresponding subset of storage elements, with the remaining storage elements being maintained in a data hold state (i.e., by feeding the storage element output back to the storage element input so that no state change occurs, by gating a load enable signal, or by gating a strobe signal coupled to an edge-trigger input of the storage element), thus saving power by avoiding data load operations within a portion of the read data pipe storage elements.

Figure 2:
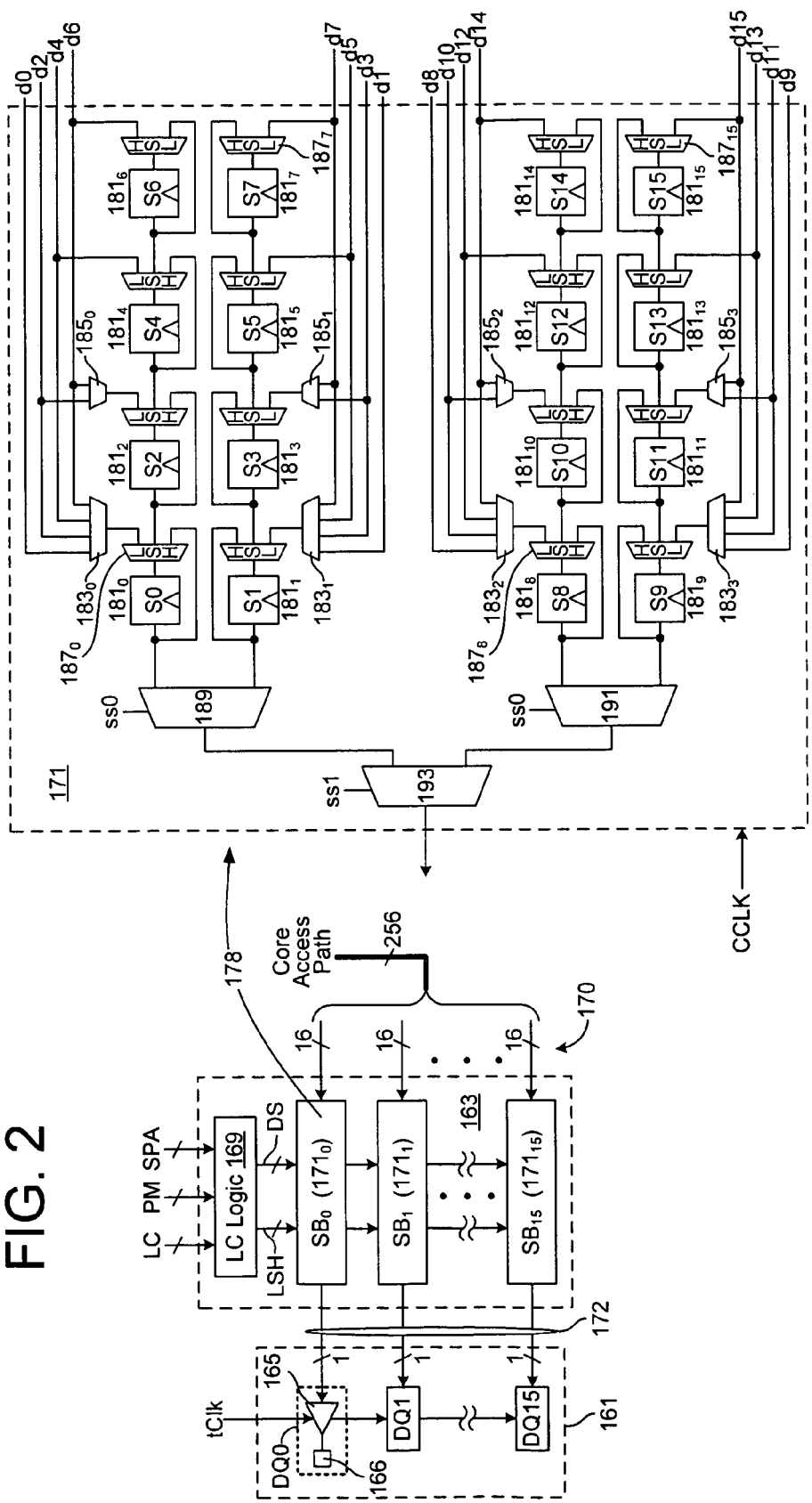
FIG. 2 illustrates an embodiment of a read data buffer that may be used to implement the read data pipe of FIG. 1.

FIG. 2 illustrates an embodiment of a read data buffer 163 that may be used to implement the read data pipe 109 of FIG. 1 and its interconnection to core access signal lines 170 (i.e., forming a core access path that corresponds to core access path 140) and to a data interface 161. The read data buffer 163 includes a load control logic circuit 169 (LC Logic) and a set of sixteen serializing buffers $171_0$-$171_{15}$. Each of the serializing buffers 171 includes inputs coupled to a respective set of sixteen of the core access signal lines 170 to receive incoming read data, and an output coupled, via a single-bit signal path (172), to a respective output driver 165 within the data interface 161. Thus, the core access signal lines 170 includes a total of 256 signal lines for conveying read data 256 bits at a time to the read data buffer 163 as rapidly as the memory core cycle time (i.e., time between successive column operations) permits. In alternative embodiments, the core access signal lines 170 may include more or fewer signal lines and/or the read data buffer 163 may include more or fewer serializing buffers 171, each having a storage capacity according to the number of incoming core access signal lines.

As shown in the detail view of data input/output node DQ0, each output driver 165 is coupled to a signal pad 166 (or to two signal pads in a differential signaling embodiment) to enable its connection to an external signaling link. In a bi-directional data bus embodiment, each signal pad 166 (or pair of signal pads in a differential signaling embodiment) is additionally coupled to a signal receiver (not shown in FIG. 2) to enable reception of incoming write data. The load control logic 169 is coupled to receive load control signals (LC), prefetch mode signals (PM) and sub-prefetch address signals (SPA) from the request logic (e.g., element 105 of FIG. 1) and outputs a common set of load-shift-hold signals (LSH) and data-select signals (DS) to each of the serializing buffers $171_0$-$171_{15}$. In one embodiment, shown in detail view 178, each of the serializing buffers 171 includes a set of sixteen storage elements, $181_0$-$181_{15}$, to capture data from the data-sourcing set of sixteen core access signal lines, d0-d15 (more or fewer storage elements may be provided according to the number of core access signal lines in alternative embodiments), data-selecting multiplexers $183_0$-$183_3$ and $185_0$-$185_3$, and load-control multiplexers $187_0$-$187_{15}$ (only two of which are explicitly enumerated in FIG. 2). The data-selecting multiplexers 183, 185 are provided to route incoming read data (i.e., received via core access signal lines D0-d15) to selected storage elements 181 in accordance with the prefetch mode indicated by the prefetch mode signals, PM. More specifically, the load control logic 169 outputs the data-select signals, DS, to the data-selecting multiplexers 183, 185 in a state that establishes the data loading arrangement indicated by the prefetch mode signals, PM. The load-control multiplexers 187 are set in response to the load-shift-hold signals, and determine which of the storage elements are loaded in a given data load operation in accordance with the load-control signals, LC, and the prefetch mode indicated by the prefetch mode signals, PM.

In one embodiment, the prefetch mode signals specify one of three prefetch modes in which different amounts of data are retrieved from the memory core and stored within the read data pipe during a column read operation: a full prefetch mode in which a full 256 bits of data is loaded from the entire set of core access signal lines 170 into the complete set of storage elements $181_0$-$181_{15}$ within serializing buffers $171_0$-$171_{15}$; a first partial prefetch mode in which 128 bits of data is loaded from half the core access signal lines 170 into half the storage elements 181 within each of the serializing buffers $171_0$-$171_{15}$ (i.e., each serializing buffer 171 receiving and storing 8 bits instead of 16 bits); and a second partial prefetch mode in which 64 bits of data is loaded from one-fourth of the core access signal lines 170 into one-fourth of the storage elements 181 within each of the serializing buffers $171_0$-$171_{15}$ (i.e., each serializing buffer 171 receiving and storing 4 bits instead of 16 bits or 8 bits). These prefetch modes, referred to herein as x16, x8 and x4 prefetch modes to indicate the amount of data stored within each of the serializing buffers and output on each signal line of the external signal path during a given memory read operation, are assumed in connection with a number of embodiments described herein, though more or fewer prefetch modes in which larger or smaller quantities of data are retrieved from or supplied to the memory core may be supported in alternative embodiments.

Still referring to FIG. 2, when the prefetch data becomes valid on the core access signal lines 170 (i.e., during a memory read operation), the request logic asserts a load command on the load control signal lines (i.e., the signal lines used to convey the load control signals, LC, including the load command) to enable the amount of data indicated by the prefetch mode signals, PM, to be loaded into the read data buffer 163. If the prefetch mode signals indicate a x16 prefetch mode, the load control logic 169 outputs data-select signals to multiplexers $183_0$-$183_3$ and $185_0$-$185_3$ to route data arriving on each set of core access signal lines d0-d15 to storage elements $S_0$-$S_{15}$, respectively, within a corresponding serializing buffer 171, and the outputs load-shift-hold signals, LSH, in the load state so that each of load-control multiplexers $187_0$-$187_{15}$ passes the data arriving on a respective one of core access signal lines D0-d15 to the data input of the corresponding storage element 181. By this operation, at the next rising edge (or falling edge) of a core cycle clock signal, CCLK (or a clock signal derived therefrom), the sixteen bits of data conveyed on each set of core access signal lines D0-d15 are loaded into respective storage elements S0-S15 within a corresponding one of the serializing buffers 171. Thus, as shown in FIGS. 3 and 4, which illustrate the selections made within the data-selecting multiplexers 183, 185 and load-control multiplexers 187, respectively, in response to the control signals supplied to the load control logic 169, in the x16 prefetch mode, data signals on core access signal lines d0-d15 are routed to the load-control multiplexers 187 for storage elements S0-S15, respectively (FIG. 3, PM=x16), and the load-control multiplexers 187 are set to pass the data signals to the data inputs of the storage elements $181_0$-$181_{15}$ when the load control signals (LC) indicate a buffer load operation. That is, the data signal present at load input 'L' of each load-control multiplexer 187 is passed through the multiplexer to the data input of the corresponding storage element 181.

When a partial prefetch mode (i.e., the x8 or x4 prefetch mode) is selected, read data is loaded from only a fraction of the core access signal lines d0-d15 into a corresponding fraction the storage elements within each serializing buffer 171, and the subprefetch address signals (SPA) are used to identify (or select) the subset of core access signal lines used to convey read data. Referring to FIG. 3, for example, when a x8 prefetch mode is selected (PM=x8) and the most significant bit of the subprefetch address is a '0' (SPA[1]=0), data-select signals are supplied to multiplexers $183_0$-$183_3$ and $185_0$-$185_3$ within each serializing buffer 171 to switchably connect core access signal lines d0-d3 and d8-d11 to the load-control multiplexers 187 for storage elements $181_0$-$181_3$ and $181_8$-$181_{11}$ (S0-S3 and S8-S11), respectively. When the most significant bit of the subprefetch address is a '1' in x8 prefetch mode, multiplexers $183_0$-$183_3$ and $187_0$-$187_3$ pass the data on the other set of eight core access signal lines, d4-d7 and d12-d15, to the load-control multiplexers 187 for storage elements $181_0$-$181_3$ and $181_8$-$181_{11}$ (S0-S3 and S8-S11), respectively. Because there are only two possible core access signal line selections in x8 mode, lines d0-d3/d8-d11 or d4-d7/d12-d15, the least significant bit of the subprefetch address, SPA[0], is ignored as indicated by the "don't care" indication, 'X', in FIG. 3. Turning to FIG. 4, when a load operation is signaled in x8 mode (PM=x8, LC=Load), the data signals present at the load inputs of the load-control multiplexers 187 for storage elements $181_0$-$181_3$ and $181_8$-$181_{11}$ (S0-S3 and S8-S11) are passed to the storage element inputs, while the outputs of storage elements $181_4$-$181_7$ and $181_{12}$-$181_{15}$ (S4-S7 and S12-S15) are passed back to their inputs via the hold inputs (H) of the corresponding multiplexers 187, thus effecting a reduced-power hold operation in those storage elements. This operation is indicated in the table of FIG. 4 by the load selection ('L') for storage elements $181_0$-$181_3$ and $181_8$-$181_{11}$ and the hold selection ('H') for storage elements $181_4$-$181_7$ and $181_{12}$-$181_{15}$.

When a x4 prefetch mode is selected and the two-bit subprefetch address is a '00' (PM=x4, SPA[1:0]=00), data-select signals are supplied to multiplexers $183_0$-$183_3$ to switchably connect core access signal lines d0-d1 and d8-d9 to the load-control multiplexers 187 for storage elements $181_0$-$181_1$ and $181_8$-$181_9$ (S0-S1 and S8-S9), respectively. Similarly, when the subprefetch address is a '01', '10' or '11' in x4 prefetch mode, multiplexers $183_0$-$183_3$ pass the data on core access signal lines d2-d3/d10-d11, d4-d5/d12-d13 or d6-d7/d14-d15, respectively, to the load-control multiplexers 187 for storage elements $181_0$-$181_1$ and $181_8$-$181_9$. Turning to FIG. 4, when a load operation is signaled in x4 mode (PM=x4, LC=Load), the data signals present at the load inputs of the load-control multiplexers 187 for storage elements $181_0$-$181_1$ and $181_8$-$181_9$ are passed to the storage element inputs as indicated by the load selection, L, while the outputs of storage elements $181_2$-$181_7$ and $181_{10}$-$181_{15}$ (S2-S7 and S10-S15) are passed back to their inputs via the hold inputs (H) of the corresponding multiplexers as indicated by the hold selection, H, thus effecting a reduced-power hold operation in storage elements $181_2$-$181_7$ and $181_{10}$-$181_{15}$.

Referring again to FIG. 2, the storage elements 181 are coupled to one another through load-control multiplexers 187 to form a four-bit wide first-in-first-out (FIFO) shift register having storage elements $181_0$, $181_1$, $181_8$ and $181_9$ (S0, S1, S8 and S9) at the head of the queue. Thus, after read data has been loaded into selected storage elements 181 of a serializing buffer 171, the read data is shifted out of the serializing buffer 171 bit, by bit in respective transmit intervals. Select signals, ss0 and ss1, are provided to multiplexers 189, 191 and 193, as shown, to pick one of head-of-queue storage elements $181_0$, $181_1$, $181_8$ and $181_9$ to supply data to the corresponding output driver 165 during a respective transmission interval. In the x16 and x8 prefetch modes, the contents of some or all of the storage elements 181 are shifted forward within each of the serializing buffers $171_0$-$171_{15}$ after data initially loaded into the head-of queue storage elements has been transmitted. More specifically, when the x16 prefetch mode is selected, three shift operations are performed in succession following each data load operation to forward the data in second-stage, third-stage and fourth-stage storage element groups (i.e., storage elements S2/S3/S10/S11, S4/S5/S12/S13 and S6/S7/S14/S15, respectively) to the head of the queue. In each shift operation, the data to be shifted is passed through the shift port (S) of the load-control multiplexer 187 disposed between the output node of a given storage element 181 and the input node of the next-stage storage element 181. After the final stage of data to be transmitted has been shifted forward to the next-stage group of storage elements, the group of storage elements to which the final-stage data has been shifted need not be the recipient of further incoming shifted data, and thus may be placed in a data hold state during subsequent data shift cycles to save power. For example, after an initial data load operation, data need not be shifted into the fourth-stage storage elements (S6/S7/S14/S15), so that no data need be shifted into the fourth-stage storage elements (note that, in an alternative embodiment, the shift input may be omitted from the load-control multiplexers 187 for the fourth-stage storage elements S6/S7/S14/S15). After a first shift operation in the x16 prefetch mode, data need not be shifted into the third-stage storage elements (S4/S5/S12/S13) so that the load control logic 169 may select a hold state (i.e., by appropriate setting of the data select signals, DS) for the third-stage storage elements to save power. Similarly, after a second shift operation in the x16 prefetch mode, data need not be shifted into the second-stage storage elements (S2/S3/S10/S11) so that the load control logic 169 may additionally select a hold state for the second-stage storage elements. When the x8 prefetch mode is selected, one shift operation is performed following each data load operation to forward read data from the second-stage storage elements (S2/S3/S10/S11) to the head-of-queue first-stage storage elements (S0/S1/S8/S9). Thus, data is not shifted into the third-stage or fourth-stage storage elements so that a hold state may be selected for those storage elements to save power. FIG. 4 illustrates exemplary selections within the load-control multiplexers 187 of FIG. 2 during a shift operation (LC=Shift) for each of the prefetch modes. As shown, in a x16 prefetch mode shift operation, the shift input path (S) through each of the load-control multiplexers 187 is selected for the first, second, and third stage storage elements (S0-S5 and S8-S13), while the fourth-stage storage elements are maintained in a hold state (H). In a x8 prefetch mode shift operation, the shift input path through each of the load-control multiplexers 187 is selected for the first stage storage elements (S0/S1/S8/S9) only, with all other storage elements left in the hold state. No shifting occurs in the FIG. 2 embodiment in the x4 prefetch mode.

In one embodiment, the core cycle time (i.e., time between successive column access operations) remains fixed as different prefetch modes are selected, thus leading to unused transmission bandwidth on the external data path in partial prefetch modes. That is, when a full (e.g., x16) prefetch mode is selected, data retrieved from the memory core is loaded into the full set of storage elements within each of the serializing buffers $171_0$-$171_{15}$ and then shifted out in a sequence of three shift operations (each shift following the transmission of the four bits in the first-stage storage elements S0/S1/S8/S9), thus consuming the entire data path bandwidth before transmitting the read data for a subsequent read access (or write data for a subsequent write access). By contrast, when a x4 partial prefetch mode is selected, read data is loaded only into the first-stage storage elements of the serializing buffers 171 with three hold states (i.e., states in which no load or shift operations occur within the serializing buffers) following transmission of the four bits of data on each line of the external data path, and when a x8 partial prefetch mode is selected, read data is loaded only into the first-stage and second-stage storage elements of the serializing buffers 171, followed by a shift state and then two hold states. An exemplary load-control state diagram, implemented, for example, by state machine circuitry within the request logic 105 of FIG. 1 or other control circuitry, is illustrated in FIG. 5. Thus, starting from the load state (Load) in which data is loaded into all or a subset of storage elements within the serializing buffers 171 of FIG. 2, if a x4 prefetch mode is selected, the state machine progresses to Hold1, Hold2 and Hold3 states before returning to the Load state to load the next set of x4 prefetch data. In each of the Hold1, Hold2 and Hold3 states, all the storage elements 181 within the serializing buffers 171 are maintained in a hold state to save power. If a x8 prefetch mode is selected, the state machine progresses from the Load state to a Shift1 state (i.e., to shift data from the second-stage storage elements to the first-stage storage elements within each of the serializing buffers), and then the Hold2 and Hold3 states before returning to the Load state to load the next set of x8 prefetch data. Finally, if a x16 prefetch mode is selected, the state machine progresses from the Load state to Shift1, Shift2 and Shift3 states before returning to the load state to load the next set of x16 prefetch data, thus enabling read data to be shifted forward from the fourth-stage storage elements 181 to the first stage storage elements 181 in a sequence of three data shift operations within the serializing buffers 171. Although not specifically shown, a hold state may also be entered if no memory read requests are being serviced within a given request cycle.

Figure 6:
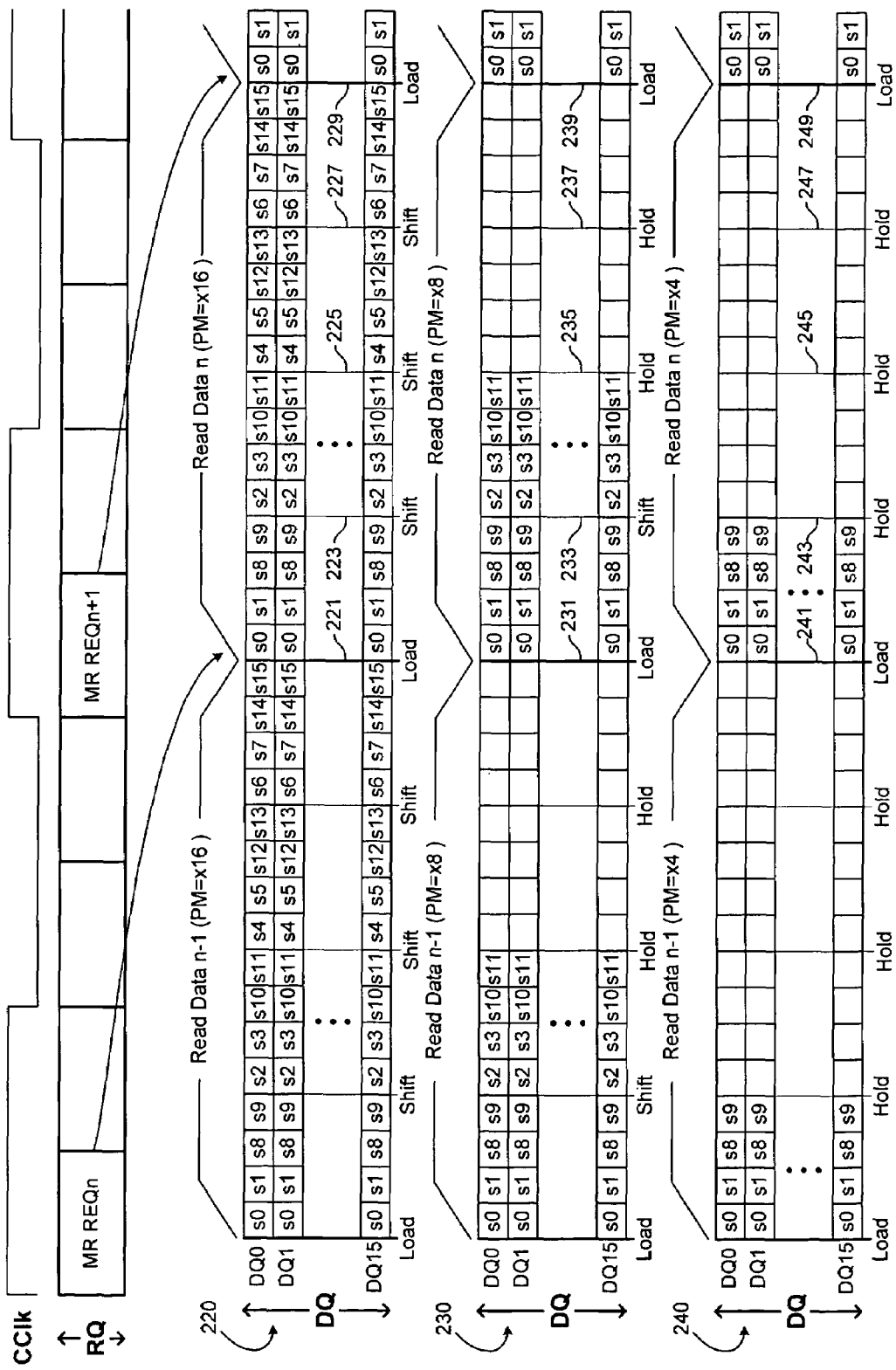
FIG. 6 illustrates exemplary data transmission sequences at the input/output (I/O) nodes of the data path interface of FIG. 2 for different prefetch mode selections.

FIG. 6 illustrates exemplary data transmission sequences at the sixteen input/output (I/O) nodes of the data path interface (i.e., element 161 of FIG. 2) for the x16, x8 and x4 prefetch modes. Assuming that an $n^{th}$ memory read request (MR REQn) is received on the request path at the start of a given core access cycle (indicated by a rising edge of core cycle clock, CCLK), then a predetermined time later, the data will be output as a stream of sixteen, eight, or four bits on each I/O node according to the prefetch mode. More specifically, referring to the data transmission sequence for the x16 prefetch mode (220), a load operation occurs at time 221 (i.e., at the conclusion of the transmission of a prior set of x16 prefetch data), followed by transmission of the contents of first-stage serializing buffer storage elements S0/S1/S8/S9 over the next four data transmission intervals. At time 223, after the contents of the first-stage storage elements have been transmitted, a first shift operation is carried out within the serializing buffers to advance the contents of the S2/S3/S10/S11 storage elements to the head-of-queue position (and to advance the contents of the third-stage and fourth-stage storage elements to the second-stage and third-stage storage elements, respectively) and thus, as shown, the contents of the S2/S3/S10/S11 are transmitted in the next four data transmission intervals. At time 225, after the data originally loaded into the second-stage storage elements has been output, a second shift operation is carried out within the serializing buffers to advance the contents originally loaded into the third-stage storage elements, S4/S5/S12/S13, to the head-of-queue position for transmission during the next four transmission intervals. At time 227, after the data originally loaded into the third-stage storage elements has been transmitted, a third shift operation is carried out within the serializing buffers to advance the contents originally loaded into the fourth-stage storage elements, S6/S7/S14/S15, to the head-of-queue position for transmission during the final four transmission intervals for the memory access request. Thereafter, at time 229, a load operation may be performed to load the next set of x16 prefetch data into the read data pipe in response to memory request, MR REQ n+1, so that data transmission may continue without interruption.

Referring to the data transmission sequence shown in FIG. 6 for the x8 prefetch mode (230), a load operation occurs at time 231 to load a x8 prefetch data set into the first-stage and second-stage storage elements within the read data pipe, followed by transmission of the contents of first-stage storage elements, S0/S1/S8/S9, over the next four data transmission intervals. At time 233, after the contents of the first-stage storage elements have been transmitted, a first shift operation is carried out within the serializing buffers to advance the contents of the second-stage storage elements (S2/S3/S10/S11) to the head-of-queue position for transmission over the next four data transmission intervals. After the data originally loaded into the second-stage storage elements has been transmitted, the memory read operation is complete and the external data path remains idle over the next eight transmission intervals as additional read data is retrieved from the memory core (i.e., in a back-to-back memory read). As discussed above, the data load operation in the x8 mode may be limited to the first-stage and second-stage storage elements within the read data pipe and no shifting of data into the third-stage storage elements is necessary during the shift operation. Further, the state of all the storage elements in the read data pipe may be held constant during the unused transmission intervals (e.g., by gating the clocking signal or by switching the storage element output to the storage element input) to save power. This operation is indicated in FIG. 6 by the hold operations at times 235 and 237. At time 239, a load operation may be performed to load the next set of x8 prefetch data into the read data pipe in response to memory request, MR REQ n+1.

Referring to the data transmission sequence shown in FIG. 6 for the x4 prefetch mode (240), a load operation occurs at time 241 to load a x4 prefetch data set into the first-stage storage elements, S0/S1/S8/S9, within the read data pipe, followed by transmission of the contents of first-stage storage elements over the next four data transmission intervals. After the contents of the first-stage storage elements have been transmitted, the memory read operation is complete and the data path remains idle over the next twelve transmission intervals as additional read data is retrieved from the core (i.e., in a back-to-back memory read). As discussed above, the data load operation in the x4 mode may be limited to the first-stage storage elements within the read data pipe. Also, as in the x8 prefetch mode, the state of all the storage elements in the read data pipe may be held constant during the unused transmission intervals (e.g., by gating the clocking signal or by switching the storage element output to the storage element input) to save power. This operation is indicated in FIG. 6 by the hold operations at times 243, 245 and 247. At time 249, a load operation may be performed to load the next set of x4 prefetch data into the read data pipe in response to memory request, MR REQ n+1.

Figure 7A:
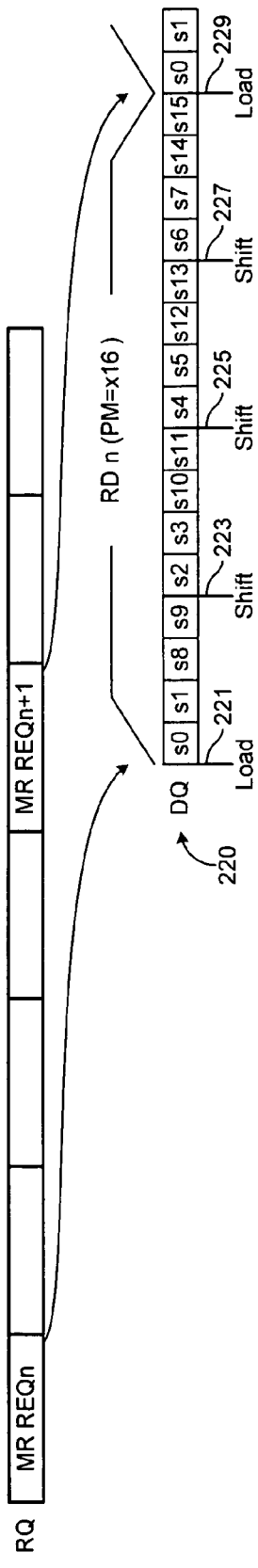
FIGS. 7A-7C illustrate operation within an alternative embodiment of a memory device in which core cycle times may be adjusted in response to different prefetch mode selections to avoid unused data path bandwidth.
Figure 7B:
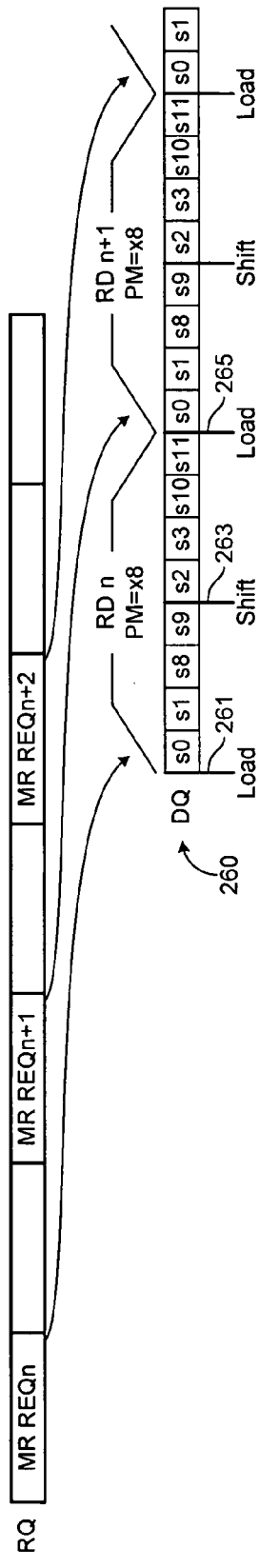
Figure 7C:
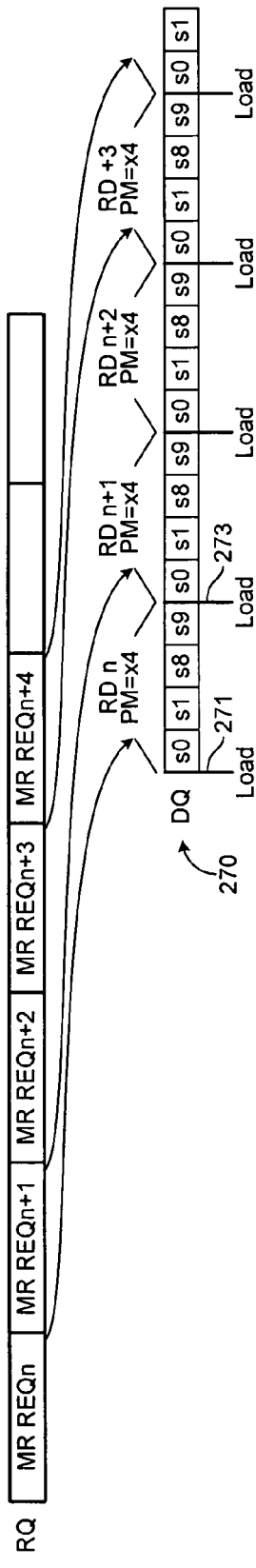

FIGS. 7A-7C illustrate operation within an alternative embodiment of a memory device in which core cycle times may be adjusted in response to different prefetch mode selections to avoid unused data path bandwidth. FIG. 7A illustrates the data transmission sequence in the full prefetch mode (i.e., x16 prefetch mode) described in reference 220 of FIG. 6 though, for simplicity, data transmission over a single data link is shown instead of the full set of N transmissions over N data links. FIG. 7B illustrates a data transmission sequence 260 in a x8 prefetch mode in which memory read requests (MR REQn, MR REQn+1, MR REQn+2, ...) are received at twice the rate as in the x16 prefetch mode, and in which the core cycle time is correspondingly halved relative to the x16 prefetch mode. Because the core cycle time has been halved, requests may be serviced at twice the rate, but half the granularity (x8) of the full (x16) prefetch mode. Thus, a x8 read data set (RD n) that corresponds to memory read request n (MR REQn) is loaded into a subset of storage elements within the read data pipe at time 261, and shifted out over the next eight transmission intervals (i.e., with second-stage data being shifted to the head of queue at time 263). At the conclusion of the eighth transmission interval (i.e., time 265), a new load operation occurs to capture the x8 read data set (RDn+1) that corresponds to memory read request n+1 (i.e., in a back-to-back read), with the data set being transferred in the immediately ensuing eight transmission intervals so that, despite the finer (reduced) data access granularity, no data path bandwidth is unused. In a data transmission sequence 270 for the x4 prefetch mode, illustrated in FIG. 7C, memory access requests are received at four times the rate as in the x16 prefetch mode and the core cycle time is correspondingly reduced by a factor of four relative to the x16 prefetch mode, thus enabling memory access requests to be serviced at four times the rate, but one-fourth the granularity (x4), of the full (x16) prefetch mode. As shown in FIG. 7C, for example, a x4 read data set (RD n) that corresponds to memory read request n (MR REQn) is loaded into a subset of storage elements within the read data pipe at time 271, and shifted out over the next four transmission intervals. At the conclusion of the fourth transmission interval (i.e., at time 273), a new load operation to capture the x4 read data set (RDn+1) that corresponds to memory read request n+1 (i.e., in a back-to-back read), with the data set being transferred in the immediately ensuing four transmission intervals so that, despite the finer data access granularity, the full data path bandwidth is consumed. Assuming a succession of back-to-back memory read operations, data sets RDn+2 and RDn+3 are transferred, in response to memory read requests n+3 and n+4, in immediately sets of four transmission intervals.

Figure 8:
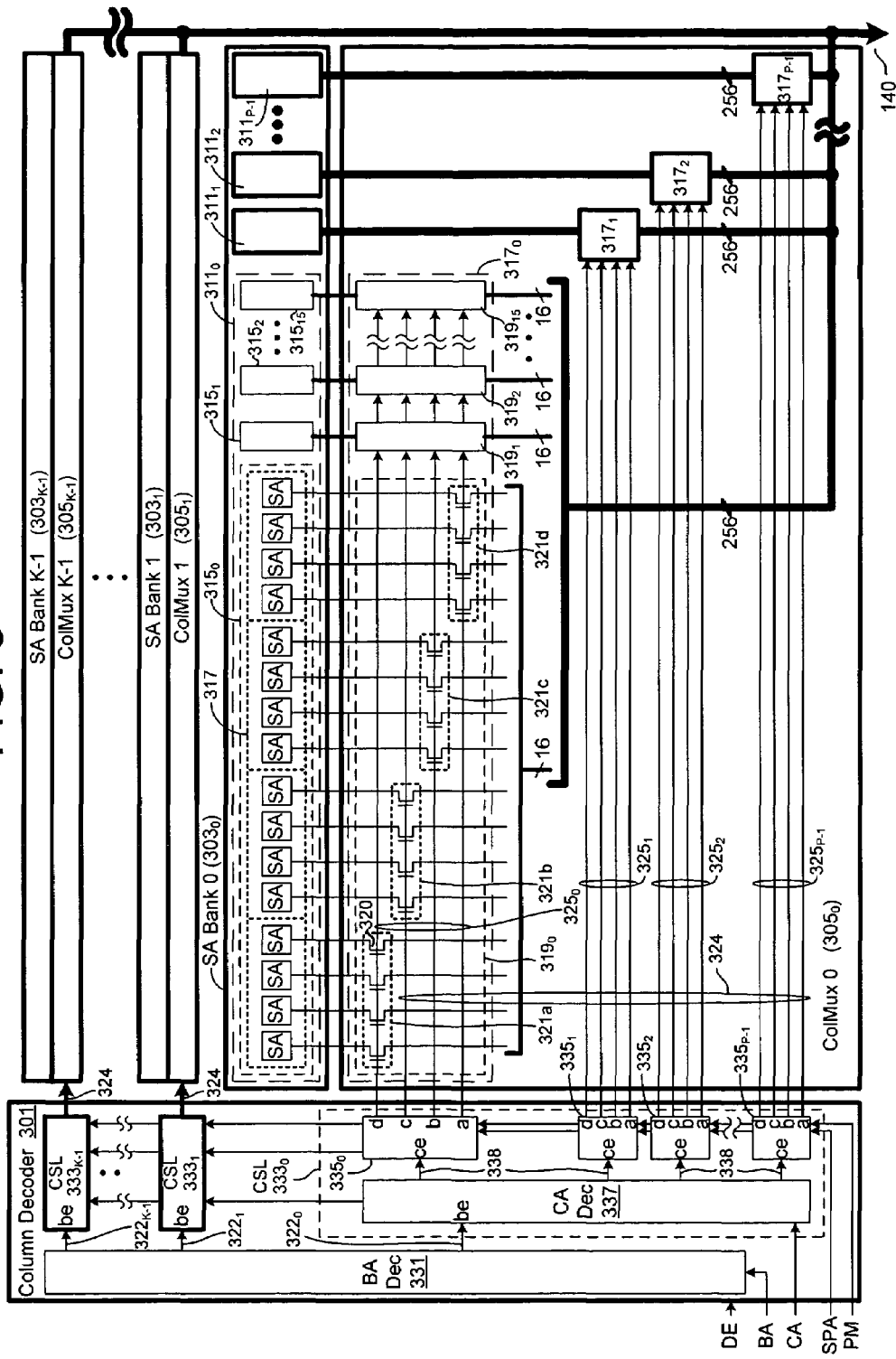
FIG. 8 illustrates embodiments of a column decoder and column multiplexers that may be used in the memory device of FIG. 1 to selectively couple sense amplifiers within various storage banks to the core access path.

FIG. 8 illustrates embodiments of a column decoder 301 and column multiplexers $305_0$-$305_{K-1}$ (ColMux0-ColMux K−1) that may be used in the memory device of FIG. 1 to selectively couple sense amplifiers within storage banks $131_0$-$131_{K-1}$ to the core access path 140. In the particular embodiment of FIG. 8, for example, column multiplexers $305_0$-$305_{K-1}$ are coupled respectively between the sense amplifier banks $303_0$-$303_{K-1}$ (SA Bank 0-SA Bank K−1) that correspond to the K storage banks 131 of FIG. 1 and the core access path 140. Each of column multiplexers 305 is further coupled to receive a column select signal 324 from the column decoder 301 which, as shown in detail view of column multiplexer $305_0$, includes J sets of prefetch select lines $325_0$-$325_{J-1}$. The column decoder 301 includes bank-address decode logic 331 and column select logic circuits $333_0$-$333_{K-1}$, and is coupled to receive a bank address (BA), column address (CA) and sub-prefetch address (SPA), as well as the prefetch mode signals (PM) and a decode enable signal (DE), from the request logic. When the decode enable signal is asserted, bank-address decode logic 331 decodes the bank address to activate the bank-address-specified one of K bank enable lines $322_0$-$322_{K-1}$ that are coupled respectively to bank-enable inputs (be) of column select logic circuits $333_0$-$333_{K-1}$. In one embodiment, each of the column select logic circuits 333 includes a column-address decoder 337 that, in response to activation of the corresponding bank enable line 322, decodes the column address to activate the column-address-specified one of J column-enable lines 338. Each column select logic circuit 333 further includes a set of J sub-prefetch decoders $335_0$-$335_{J-1}$ coupled to receive the subprefetch address and having column-enable inputs (ce) coupled respectively to the J column-enable lines 338. When the column-enable line 338 coupled to a given sub-prefetch decoder 335 is activated, the sub-prefetch decoder 335 activates one or more of prefetch select lines a, b, c and d within the corresponding set of prefetch select lines 325. The sets of prefetch select lines $325_0$-$325_{J-1}$ driven by sub-prefetch decoders $335_0$-$335_{J-1}$ within a given column select logic circuit 333 are coupled to a respective one of transfer gate circuits $317_0$-$317_{J-1}$ within the column multiplexer 305 that corresponds to the column select logic circuit 333. In one implementation, each of the transfer gate circuits 317 includes a set of sixteen subprefetch-gate circuits $319_0$-$319_{15}$ each of which includes sixteen pass-gate configured transistors coupled between a respective column 315 of sixteen sense amplifiers (SA) and a corresponding set of sixteen core access signal lines within core access path 140. More specifically, within each of the subprefetch-gate circuits 319, four groups 321a-321d of four transistors, each four-transistor group referred to herein as a quad gate 321, are coupled source-to-drain between a corresponding set 317 of four sense amplifiers (SA) and a respective set of four of the sixteen core access signal lines. The gate terminals of the transistors 320 within each quad gate 321 are coupled in common to a respective one of four prefetch select lines 325 from a corresponding sub-prefetch decoder 335. By this arrangement, each of the quad gates 321a-321d may be switched to a conducting state through activation of a corresponding one of the four prefetch select lines to form a continuous signal path (i.e., switched connection) between the corresponding set of four sense amplifiers 317 and respective core access signal lines. The prefetch mode signals (PM) and subprefetch address signals (SPA) are supplied to each of the subprefetch decoders 335 to control the number of activated quad gates and, in a partial prefetch mode, the subset of quad gates to be activated during a given column access operation. For example, in a x16 prefetch mode, a subprefetch decoder 335 coupled to an activated column-enable line 338 (i.e., an address-selected subprefetch decoder 335) will activate all four prefetch select lines 325, thus switching all four quad gates 321a-321d within a given subprefetch-gate circuit 319 to a conducting state to switchably connect the corresponding set of sixteen sense amplifiers 315 to the sixteen core access lines. In the embodiment of FIG. 8, each set of four prefetch select lines 325 extends across and is coupled in common to quad gates within each of the sixteen sub-prefetch gate circuits $319_0$-$319_{15}$ (hex-gates) so that, in the x16 prefetch mode, an address-selected column of 256 sense amplifiers (i.e., one of the sets $311_0$-$311_{J-1}$ of 256 sense amplifiers) is switchably coupled to respective signal lines of the core access path 140. When a x8 prefetch mode is selected, the subprefetch decoder 335 coupled to the activated column-enable line 338 will activate two prefetch signal lines, a/b or c/d, within a selected set of four prefetch select lines 325, depending on the most significant bit of the subprefetch address (SPA[1]), thus switching on two of the four quad gates 321a-321d within each of sub-prefetch gate circuits $319_0$-$319_{15}$ and establishing a connection between a column of 128 sense amplifiers (i.e., within one of the 256-sense amplifier sets $311_0$-$311_{J-1}$) and a 128-line subset of the core access signal lines. When a x4 prefetch mode is selected, the subprefetch decoder 335 coupled to the activated column-enable line 338 will activate one of the four prefetch signal lines (a, b, c or d), within a selected set of four prefetch select lines 325, depending on the two bits of the subprefetch address, thus switching on one of the four quad gates 321a-321d within each of sub-prefetch gate circuits $319_0$-$319_{15}$ and establishing a connection between a column of 64 sense amplifiers and a 64-line subset of the core access signal lines.

Figures 9, 10:
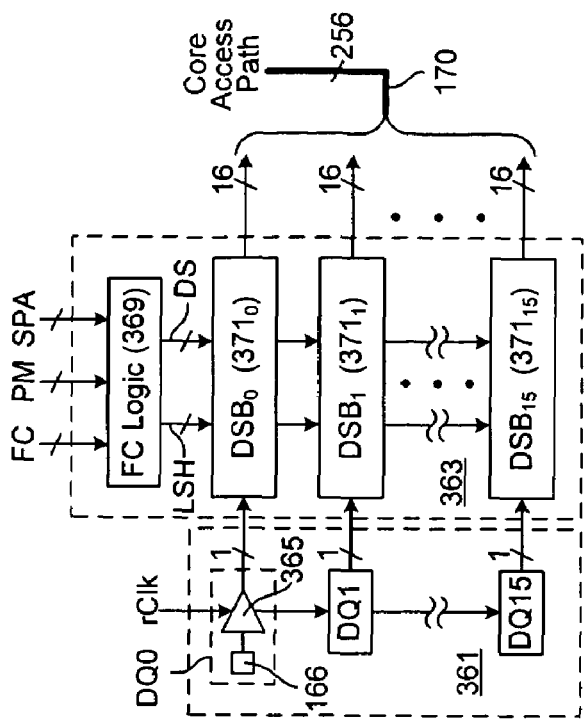
FIG. 9 illustrates an exemplary decoding operation performed by each of the subprefetch decoders of FIG. 8.
FIG. 10 illustrates an embodiment of a write data buffer that may be used to implement the write data pipe of FIG. 1.

FIG. 9 illustrates an exemplary decoding operation performed by each of the subprefetch decoders 335 of FIG. 8. As shown, when the column-enable input, ce, is a logic '0' (i.e., corresponding column-enable line 338 is deactivated), none of the prefetch signal lines (a, b, c, d) is activated, regardless of the prefetch mode (PM) and the subprefetch address (SPA); the prefetch mode and subprefetch address thus being designated by don't care symbol 'X'. When the column-enable input is high in the x16 prefetch mode (ce=1, PM=x16), all four of the prefetch signal lines are activated (a=b=c=d=1), and the subprefetch address is ignored. When the column-enable input is high in the x8 prefetch mode (ce=1, PM=x8), either the a/b or c/d pair of prefetch signal lines is activated depending on the state of the most significant subprefetch address bit, SPA[1]. The least significant subprefetch address bit, SPA[0], is ignored. When the column-enable input is high in the x4 prefetch mode (ce=1, PM=x4), one of the four prefetch signal lines, a, b, c or d, is activated according to the state of the two-bit subprefetch address.

FIG. 10 illustrates an embodiment of a write data buffer 363 that may be used to implement the write data pipe 111 of FIG. 1. The write data buffer 363 includes framing control logic 369 and a set of deserializing buffers $371_0$-$371_{15}$, each coupled to a respective write data receiver 365 (which, for example, samples the signal arriving at pad 166 in response to a receive clock rClk) within the data interface 361. In general, each of the deserializing buffers $371_0$-$371_{15}$ performs the inverse function of the serializing buffers 171 described in reference to FIG. 2, receiving a serial stream of 16, 8 or 4 bits per memory write operation according to the prefetch mode, PM (longer or shorter bitstreams may be received in alternative embodiments that support other prefetch modes), and framing the bits in corresponding 4-bit, 8-bit or 16-bit wide data values, referred to herein as data frames, that are driven onto respective sets of 4, 8 or 16 core access signal lines within core access path 140. The framing control logic 369 controls the time at which data frames are driven onto the core access signal lines, and the prefetch mode (PM) and subprefetch address (SPA) are used to select, through generation of load-shift-hold signals (LSH) and data-select signals (DS) within the framing logic 369, which storage elements within the write data buffer 363 are loaded with incoming write data bits and which core access signal lines are driven with bits of a given data frame. More specifically, when the prefetch mode signals indicate a x16 prefetch mode, all the storage elements within each deserializing buffer 371 of the write data buffer 363 are loaded with bits of a 16-bit data frame, and then driven onto a corresponding set of sixteen core access signal lines, thus providing a 256 bit write data value on the core access signal path. When, a x8 prefetch mode is selected, half the storage elements within each deserializing buffer 371 are loaded with bits of an 8-bit data frame, and then used to drive (i.e., switchably connected to) one of two sets of 8 core access signal lines (i.e., within the set of sixteen core access signal lines that corresponds to the deserializing buffer 371) according to the most significant bit of the subprefetch address, SPA. When a x4 prefetch mode is selected, one-fourth of the storage elements within each deserializing buffer 371 are loaded with bits of a 4-bit data frame, and then used to drive one of four sets of 4 core access signal lines according to the two-bit subprefetch address, SPA. As discussed above, write masking information may also be received via the data interface, with write masking bits indicating which bytes (or other data segments) of the incoming data are to be written to the memory core. In such an embodiment, the deserializing buffers 371 may selectively drive core access lines in response to both the write masking bits and the selected prefetch mode.

Figure 11:
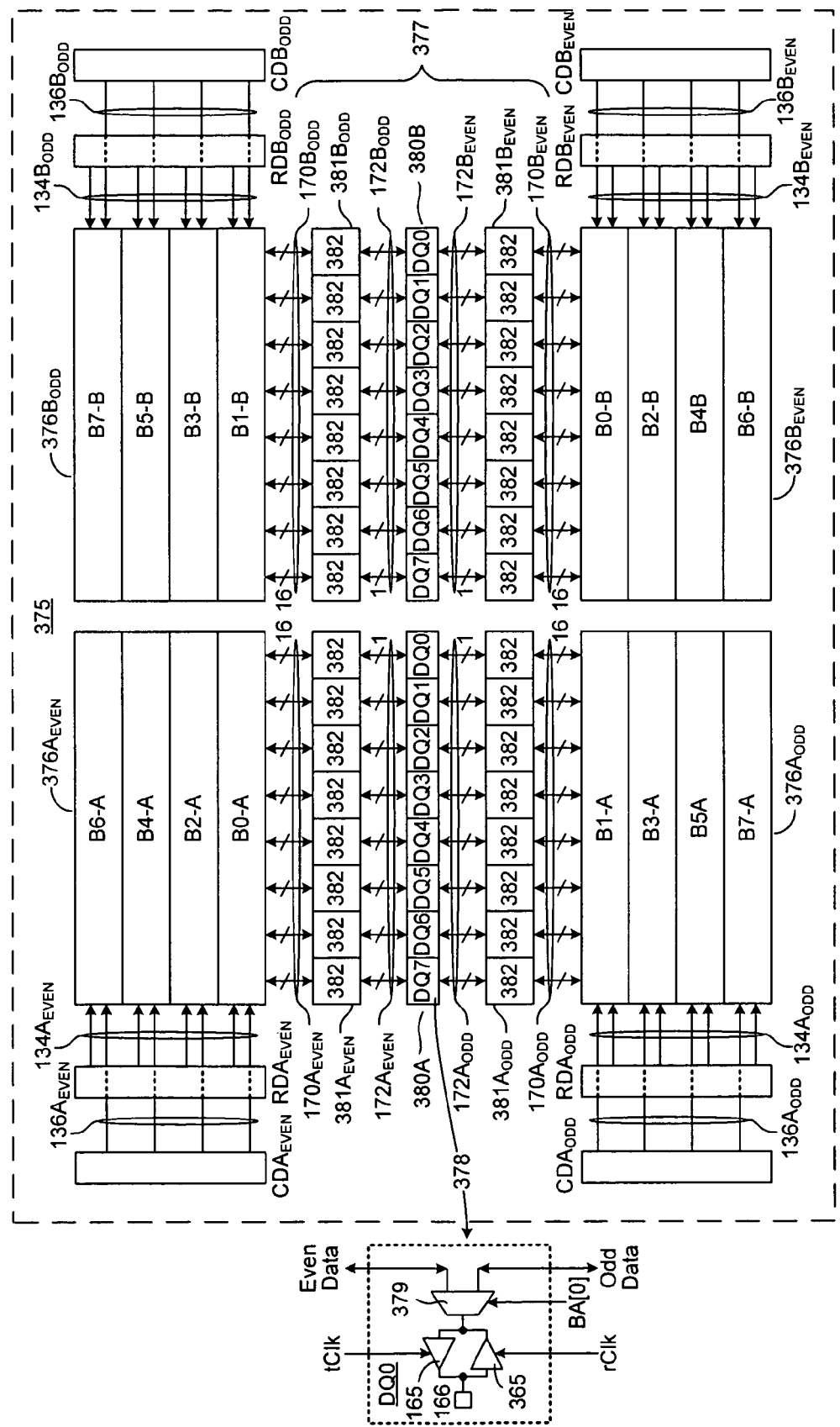
FIG. 11 illustrates an embodiment of a memory device having circuitry to support scaled prefetch modes as well as mode-selectable data transfer rates and data access timing.

FIG. 11 illustrates an embodiment of a memory device 375 having circuitry to support scaled prefetch modes as well as mode-selectable data transfer rates and data access timing. In the particular embodiment shown, memory device 375 is a dynamic random access memory (DRAM) device having eight, separately accessible DRAM storage banks (B0-B8), each partitioned into cater-corner -A and -B sub-banks. The even-numbered storage banks (B0, B2, B4, B6) are disposed opposite the odd-numbered storage banks (B1, B3, B5, B7) about a central data input/output (I/O) interface 377, thus forming four sub-bank quadrants $376A_{EVEN}$, $376B_{EVEN}$, $376A_{ODD}$ and $376B_{ODD}$. Each sub-bank quadrant 376 is coupled via a respective set of core access signal lines, $170A_{EVEN}$, $170B_{EVEN}$, $170A_{ODD}$ and $170B_{ODD}$, to a respective data pipe $381A_{EVEN}$, $381B_{EVEN}$, $381A_{ODD}$ AND $381B_{ODD}$. In the particular embodiment shown, each of the data pipes 381 includes a set of eight I/O buffers 382, with each I/O buffer 382 coupled between a respective 16-line subset of the core access signal lines 170 and a one-line connection to a corresponding data I/O circuit (shown in FIG. 11 and referred to herein as "DQ") within I/O circuit bank 380A or 380B. Thus, each DQ is shared by odd and even sub-banks and may include a multiplexer/demultiplexer 379 as shown in detail view 378 to select between corresponding even and odd I/O buffers as a transmit data source or receive-data destination. Read data and other out-bound data is output from the memory device 375 via I/O node 166 by output driver 165 in response to transitions of a transmit clock signal (tClk), while write data and other in-bound data is received within the memory device via I/O node 166 by signal receiver 365 in response to transitions of a receive clock signal (rClk). The transmit and receive clock signals, or either of them, may be a periodic timing signals such as strobe signals and may be supplied from an external source or derived from an externally supplied timing signal. Further, in one embodiment, the transmit and receive clock signals are phase aligned (and may be the same clock signal or generated by a clock tree circuit to establish phase alignment) with each other and/or with an externally supplied clock signal so that a single clock domain applies within the memory device.

Still referring to FIG. 11, separate column decoder circuits ($CDA_{EVEN}$, $CDB_{EVEN}$, $CDA_{ODD}$ and $CDB_{ODD}$) and row decoder circuits ($RDA_{EVEN}$, $RDB_{EVEN}$, $RDA_{ODD}$ and $RDB_{ODD}$) are provided for each of the sub-bank quadrants 376. In one embodiment, the even-bank row decoder circuits $RDA_{EVEN}$ and $RDB_{EVEN}$ are coupled to receive the same incoming address and control signals from a request controller and the even-bank column decoder circuits $CDA_{EVEN}$ and $CDB_{EVEN}$ are likewise coupled to receive the same incoming address and control signals (not shown in FIG. 11), so that the even-bank decoder circuits operate in lock step to enable simultaneous access to both sub-banks of an even-numbered storage bank. The odd-bank decoder circuits may also be coupled to receive the same incoming address and control signals from the request controller and thus operate in lock step to enable simultaneous access to both sub-banks of an odd-numbered storage bank. In alternative embodiments, each of the column decoder circuits and each of the row decoder circuits may be operated independently, to enable independent access to each sub-bank quadrant 376.

Though not specifically shown, the even-bank and odd-bank row decoder circuits are coupled to receive bank address and row address values from the request logic and thus each activate one address-selected word line within respective sets of word lines $134A_{EVEN}$, $134B_{EVEN}$, $134A_{ODD}$ and $134B_{ODD}$ to carry out row activation and precharge operations in the address-selected bank and row of the corresponding sub-bank quadrant 376. The even-bank and odd-bank column decoder circuits are coupled to receive bank address and column address values and thus provide column multiplexing signals $136A_{EVEN}$, $136B_{EVEN}$, $136A_{ODD}$ and $136B_{ODD}$ to couple an address-selected column of sense amplifiers within an address-selected bank to the core access signal lines 170 for the corresponding sub-bank quadrant 376. As in the embodiments described above, a prefetch mode value may be programmed within a configuration circuit (e.g., a mode register) of the memory device 375 or otherwise supplied to the memory device to control the number of column access signal lines 170 used to receive data from or deliver data to an address selected column of sense amplifiers, and to control the number of storage elements within the I/O buffers 382 that are loaded with read data or write data.

Reflecting on the organization of the storage banks and constituent sub-banks within the memory device 375, it can be seen that the even and odd storage banks are coupled in parallel to I/O circuit banks 380A and 380B. In one embodiment, the distinct access paths formed by the parallel-coupled even and odd storage banks is exploited to achieve reduced data transfer granularity in an operating mode referred to herein as a micro-thread mode. More specifically, in a first operating mode referred to herein as a single-thread mode (or single-thread mode), either an odd numbered storage bank or an even numbered storage bank is accessed over the entire duration of a column access cycle, referred to herein as a $T_{CC}$ interval. By contrast, in the micro-thread mode, the $T_{CC}$ interval is split between accesses to odd and even numbered storage banks, with one resource (an odd or even numbered storage bank) accessed during a first portion of the $T_{CC}$ interval and another resource (an even or odd numbered storage bank) accessed during a second portion of the $T_{CC}$ interval. In another micro-thread mode, the sub-bank quadrants are accessed independently of one another to provide four distinct memory resources that may be accessed in respective portions of a $T_{CC}$ interval. The $T_{CC}$ interval may be further subdivided as additional independently accessible (e.g., independently addressable) memory resources are provided.

In one embodiment, the memory device 375 includes a configuration circuit (e.g., a volatile or non-volatile mode register) which may be loaded (i.e., programmed) with mode selection information including a clock-to-core ratio in the form of a $T_{CC}$ count value that indicates the minimum number of clock cycles per $T_{CC}$ interval (and thus a clock frequency for a specified $T_{CC}$ interval), and a thread mode value that indicates the number of column access operations to be performed per $T_{CC}$ interval. The mode selection information may further include a data rate specifier that indicates the number of data bits transferred per clock cycle (data rate may alternatively be fixed by design) and/or a prefetch mode value to indicate the number of data bits transferred to or from the memory device per column access operation per data I/O node. In an alternative embodiment, instead of explicitly programming the prefetch mode within the memory device 375, the prefetch mode may be established according to the clock-to-core ratio (e.g., $T_{CC}$ count), thread mode and data rate as follows:

$$PM = (\text{data rate} * T_{CC} \text{ count})/\text{thread mode}$$

Thus, in a double data rate device in which the $T_{CC}$ count is set to 8 (indicating that transmit/receive clock signals cycle eight times per $T_{CC}$ interval) and the thread mode is set to 1 (i.e., one column access operation per $T_{CC}$ interval, referred to herein as single-thread mode), the prefetch mode may be automatically set to (2*8)/1=16 bits per DQ per column access operation. If the $T_{CC}$ count is left at 8 and the thread mode is changed to 2 (i.e., a first micro-thread mode in which two column access operations are performed per $T_{CC}$ interval), the prefetch mode drops to 8 bits per DQ per column access operation. Further, if the $T_{CC}$ count is increased to 16 (i.e., indicating a doubling of the transmit/receive clock rate), and the thread mode is set to 2, the prefetch mode may be automatically set to (2*16)/2=16 bits per DQ per column access operation. In other embodiments, the thread mode may be increased to 4 (e.g., where individual sub-bank quadrants are accessed at respective column addresses) or any other number that is supported by independently accessible memory resources within the memory device.

Figure 12C:
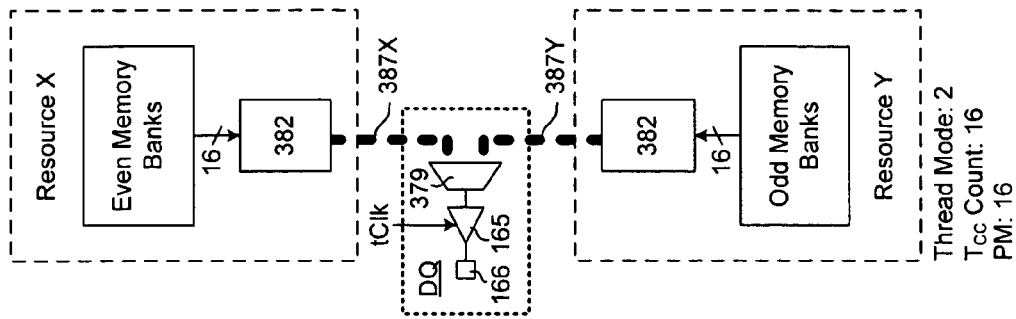
FIGS. 12A-12C illustrate memory access modes that may be selected or programmed within the memory device of FIG. 11.
Figure 12B:
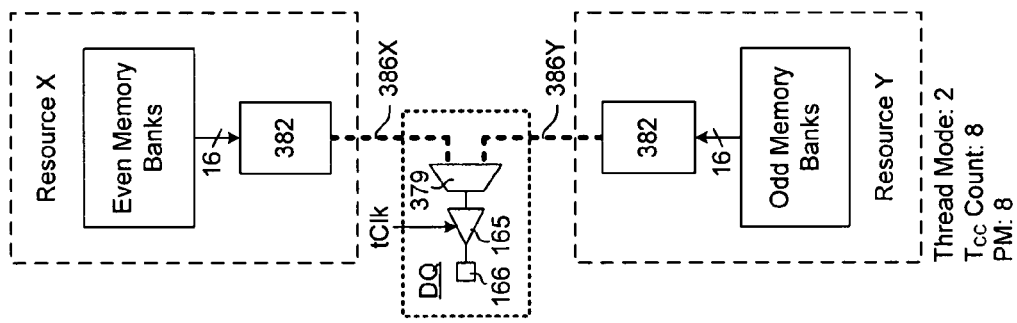
Figure 12A:
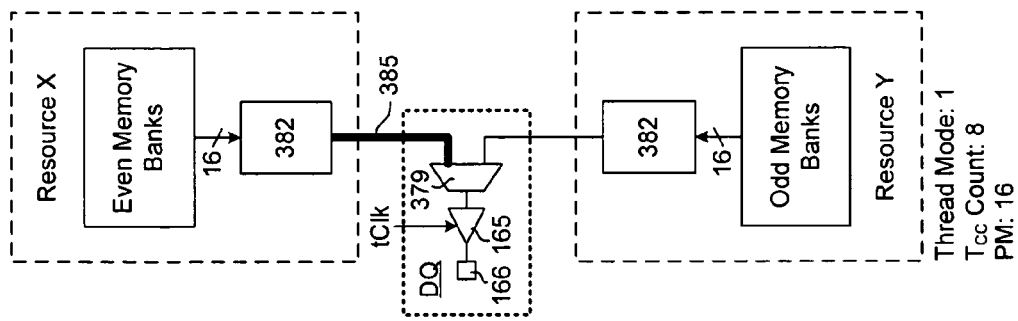

FIGS. 12A-12C illustrate memory access modes that may be selected or programmed within the memory device 375 of FIG. 11, and FIGS. 13A-13C illustrate corresponding request and data transfer operations in the different memory access modes. Referring first to FIGS. 12A and 13A, which illustrate the single-thread, $T_{CC}$ count=8 example described above, data is delivered to each DQ from a single memory resource, X (e.g., the even memory banks in this example, as indicated by bolded signal path 385), over an entire $T_{CC}$ interval. This operating mode corresponds to the data transmission sequence shown at 220 of FIG. 6 (i.e., PM=x16), with each incoming column request (Col Req n, Col Req n+1, ... as shown in FIG. 13A) resulting a full prefetch load into a set of 16-bit read data buffers (i.e., as described in reference to FIG. 2) and a corresponding 16-bit data transmission over $T_{CC}$ time interval, $T_{CC}$ n. Thus, the memory access granularity (i.e., amount of data retrieved or written per column access operation) is 16 bits per DQ or, in the 16-DQ embodiment of FIG. 11, 32 bytes total. As shown in FIG. 13A, load and shift operations are carried out as described in reference to the x16 prefetch mode operation of FIG. 6, with a buffer load occurring at the start of each new $T_{CC}$ time interval, followed by three shift operations spaced at two transmit clock cycle intervals.

FIGS. 12B and 13B illustrate the micro-thread, $T_{CC}$ count=8 example described above, with data being delivered to each DQ from two different memory resources, X and Y (i.e., the even and odd memory banks as indicated by dashed signal paths 386X and 386Y) during respective halves of a $T_{CC}$ interval. In this operating mode, a x8 prefetch mode is established as eight bits of data are loaded into an I/O buffer 382 per column access operation. In contrast to the x8 prefetch mode shown at 230 of FIG. 6, however, the full bandwidth of the signaling path is consumed by read or write data transfer due to transmission of data to or from the alternate memory resource in the second half of the $T_{CC}$ interval. As shown in FIG. 13B, column access requests are provided twice as frequently as in the single-thread mode example of FIGS. 12A and 13A, with column access requests being directed alternately to resource X and resource Y (i.e., col reqX n, col reqY n, col reqX n+1, etc.). From the stand point of the read data buffer of FIG. 2, half the storage elements 181 are loaded in response to each column read request (thus establishing the x8 prefetch mode), but buffer load operations are carried out twice per $T_{CC}$ interval as shown at 391X and 391Y of FIG. 13B, thereby ensuring sufficient data retrieval to consume the entire data transfer bandwidth on the external signaling link. Half the storage elements within the deserializing buffers 371 of FIG. 10 are likewise loaded in per column write operation. As in the x8 prefetch mode discussed in reference to FIG. 6, only half the column access lines need be driven by read or write data during a given column access operation. Overall, the micro-thread mode of operation enables the full bandwidth of the data path to be consumed with read and write data transfers, but with memory access granularity reduced to 8 bits per DQ or, in the 16-DQ embodiment of FIG. 11, 16 bytes total.

FIGS. 12C and 13C illustrate the micro-thread, $T_{CC}$ count=16 example described above, with data again being delivered to each DQ from two different memory resources, X and Y, during respective halves of a $T_{CC}$ interval, but at a faster rate (illustrated by the heavier bolding of signal paths 387X and 387Y in FIG. 12C relative to those same paths (386) in FIG. 12B). In this operating mode, a full x16 prefetch mode is established as sixteen bits of data are loaded into an I/O buffer 382 per column access operation. In contrast to the x16 prefetch mode shown at 220 of FIG. 6, however, the micro-thread memory access permits the data transfer rate on the signaling path to be doubled without necessitating a doubling of internal data transfer resources of the memory device. As shown in FIG. 13C, column access requests are provided twice as frequently as in the single-thread mode example of FIGS. 12A and 13A, with column access requests being directed alternately to resources X and Y (i.e., col reqX, col reqY, col reqx, col reqY, etc.). In the particular embodiment shown, the request signaling rate is assumed to scale with the data transfer rate (i.e., request signaling rate also doubled) so that requests are transferred over intervals that are one half as long as those in FIG. 12A, thus leaving relatively the same amount of request path bandwidth. Also, because a full x16 prefetch operation and corresponding 16-bit data transmission per DQ is completed twice per $T_{CC}$ interval, the rate at which the load-control state machine (e.g., as described in reference to FIG. 5) transitions from state to state is doubled. Thus, the clocking rate of the load-control state machine may be controlled by the $T_{CC}$ count programmed within the memory device or directly by a frequency divided version of the transmit/receive clock signals (or signals having a frequency relation thereto).

Overall, the micro-thread mode of operation shown in FIGS. 12C and 13C enables the full bandwidth of the data path to be consumed at the increased signaling rate without increasing the column access granularity relative to the operating mode of FIGS. 12A and 13A (i.e., column access granularity remains at 16 bits per DQ despite the doubling of net data transferred). Said another way, in absence of the micro-thread mode, doubling the data transfer rate would necessitate doubling of the column access granularity in order to consume the full data path bandwidth (i.e., increasing column access granularity to 32 bits per DQ or, in the embodiment of FIG. 11, 64 bytes total) and, in turn, require corresponding increase in data transfer resources within the memory device. For example, the read and write data buffer sizes and number of core access lines would double. This result is particularly undesirable in applications that do not benefit from larger column access granularity (e.g., where relatively small, dispersed data accesses are needed). Thus, the micro-threading operation permits signaling rate increases and correspondingly increased memory bandwidth without increase in memory access granularity.

Returning to FIG. 11, it should be noted that, instead of automatically establishing the prefetch mode according to the clock-to-core ratio, thread mode and data rate, the thread mode may itself be automatically established according to the clock-to-core ratio (e.g., $T_{CC}$ count), data rate and prefetch mode as follows:

$$\text{thread mode} = (\text{data rate} * T_{CC} \text{ count})/PM$$

Thus, in a memory device having a given data rate and prefetch mode (either or both of which may be programmed or fixed by design), the thread mode may be established by the $T_{CC}$ count value programmed within the configuration register. More specifically, when the $T_{CC}$ count value specifies a clock frequency so limited as to require substantially the entire $T_{CC}$ interval to complete a read or write operation directed to a given storage resource (e.g., entire $T_{CC}$ interval required transmit data prefetched from an addressed resource), the request logic within the memory device may automatically operate in a single-thread mode to permit random access to any bank, sub-bank or other resource of the storage array. By contrast, when the $T_{CC}$ count value specifies a clock frequency in which single-thread mode is insufficient to meet peak data transfer capability of the data I/O interface 377, the memory device may automatically operate in a multi-thread mode in which prefetch operations (or data write operations) are interleaved between multiple distinct resources in each $T_{CC}$ interval, with each such resource being independently addressed. From the perspective of a host controller, after programming the memory device with a first $T_{CC}$ count value that will yield a single-thread mode of operation within the memory device, memory access requests are directed, without address limitation, to a single memory bank or other storage resource per $T_{CC}$ interval. That is, if the $T_{CC}$ count is programmed with an integer value, N, that is below a multi-thread threshold, the memory device will operate in a single-thread mode, transferring data associated with each controller-supplied address between the data I/O buffers 382 and I/O signaling interface (i.e., data I/O circuits, DQ) during each of N cycles of the clock signal. By contrast, after programming the memory device with a $T_{CC}$ count value that will yield a multi-thread operating mode within the memory device, memory access requests are directed to multiple independently accessible storage resources per $T_{CC}$ interval, with the constraint that a given resource is accessed only once per $T_{CC}$ interval. For example, if the $T_{CC}$ count is programmed with integer value, N, that meets or exceeds the multi-thread threshold, the memory device may transfer data associated with a first address between the data I/O buffers 382 and the data I/O circuits during each of X cycles of the clock signal (X<N) and immediately thereafter transfer data associated with one or more additional addresses between the data I/O buffers 382 and the data/O circuits during each of an additional set of X cycles of the clock signal. The ratio of N to X corresponds to the thread mode established within the memory device (e.g., N/X=1, corresponds to a thread mode of 1 (single-thread mode); N/X=2, corresponds to a thread mode of 2; NIX=4 corresponds to a thread mode of 4, etc.). The memory controller may determine the $T_{CC}$ count values that correspond to the different thread modes of the memory device, for example, by obtaining or determining the $T_{CC}$ interval (and data rate and/or prefetch size) of the memory device from information stored within a serial presence detect memory or other characterizing storage device. Thereafter, the memory controller may issue a TCC count value (or other value that indicates a desired clock-to-core ratio) to the memory device in association with one or more instructions to store the TCC count value within a configuration register (e.g., a mode register) of the memory device, and thus establish a desired clock-to-core ratio therein. In another alternative embodiment, instead of automatically establishing the prefetch mode or the thread mode, the clock-to-core ratio (e.g., $T_{CC}$ count value) may be automatically established according to the thread mode, prefetch mode and data rate programmed (or fixed by design) within the memory device. Also, while the $T_{CC}$ count value has been described as specifying the number of cycles of a transmit or receive clock cycle per $T_{CC}$ interval, the $T_{CC}$ count value may alternatively specify the number of cycles of a reference clock signal or master clock signal provided to or generated within the memory device. For example, in one embodiment, a master clock signal is provided to the memory device from an external source (e.g., a memory controller) and used to establish a unified clock domain within the memory device. In such an embodiment, separate clock signals and/or strobe signals may be transmitted between the memory device and memory controller to time the transmission and reception of data, with such signals having a frequency (or a peak toggle rate in the case of a strobe signal) that is the same as or a multiple (including a fractional multiple) of the master clock signal.

Figure 14:
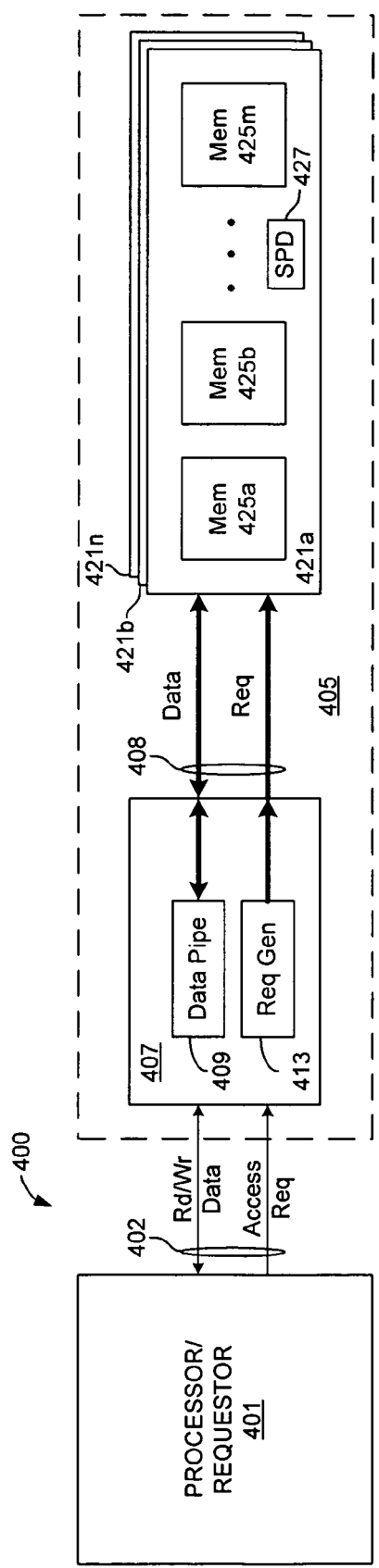
FIG. 14 illustrates an embodiment of a data processing system having a processor 401 and a memory subsystem that supports scaled prefetch modes.

FIG. 14 illustrates an embodiment of a data processing system 400 having a processor 401 (or any other memory access requestor) and a memory subsystem 405 that supports selectable prefetch modes and clock-to-core ratios. The memory subsystem 405 includes a memory controller 407 coupled to one or more memory modules 421a-421n, with each memory module 421 including one or more memory devices 425a-425m (e.g., discrete integrated circuit devices) and, optionally, a serial-presence detect 427 memory (SPD) or other non-volatile storage that provides characterizing information for the corresponding memory devices 425. In one embodiment, the characterizing information may specify the prefetch mode capability of the corresponding memory devices 425 (e.g., that the memory devices 425 have multiple prefetch modes and their respective prefetch sizes, and/or that the core cycle times of the memory devices may be increased in one or more partial prefetch modes to avoid unused data path bandwidth) in addition to storage capacity, maximum operating frequency and/or other memory device characteristics. The characterizing information may further specify thread modes that are available within the memory devices, as well as $T_{CC}$ count ranges supported by the memory devices. By this arrangement, the memory controller 407 may read the characterizing information from the SPD 427 for each memory module 421 (or an SPD or like device for the set of memory modules) and identify one or more memory modules 421 as supporting scaled prefetch modes, multiple thread modes and/or multiple $T_{CC}$ count values. In one embodiment, the memory controller 407 may program prefetch modes, thread modes and/or $T_{CC}$ count values within the memory devices 425 (or subset thereof) according to application needs or to establish uniform operation over all the memory modules 421. For example, if the set of memory modules 421 includes a hybrid assortment of scaled-prefetch memory modules (i.e., those memory modules bearing scaled-prefetch memory devices) and conventional memory modules, the memory controller 407 may program configuration registers within the memory devices 425 of the scaled-prefetch memory modules to establish uniform prefetch sizes across the memory devices 425 within each of the memory modules 421. Similarly, if the set of memory modules 421 includes a hybrid assortment of micro-threading memory modules (i.e., memory modules having constituent memory devices that support micro-thread operation) and conventional memory modules, the memory controller 407 may program configuration registers within the memory devices 425 of the micro-threading memory modules to establish uniform clock-to-core ratios and/or thread modes within each of the memory modules 421. Alternatively, the memory controller 407 (or processor) may allocate data storage within the memory modules according to prefetch-mode scalability and/or micro-threading capability. For example, the processor 401 may instruct the memory controller 407 to allocate storage within the scaled-prefetch, micro-threading memory modules to graphics applications or other applications programs that may benefit from finer-grained data prefetch and column access granularity.

With respect to a prefetch mode selection, thread mode selection or clock-to-core timing selection within a given memory module 421, the memory controller 407 may dynamically transition the memory module 421 or any of the memory devices 425 thereon between various modes, for example, in response detecting a threshold density of fine-grained memory access requests (i.e., a threshold number of such access requests within a given time interval or a threshold percentage of total memory access requests) from the processor/requestor 401 or in response to an explicit mode command from the processor/requestor 401.

Within the memory controller 407, a request generator 413 is provided to generate memory access requests and operational requests to configure the memory devices (including programming prefetch modes), read the SPD, perform signaling calibration, refresh operations, and so forth, in response to access requests from the processor 401 received via host interface path 402 (which may include separate data and request components as shown or a time-multiplexed path). A data pipe 409 is provided to buffer read and write data associated with the memory access requests and/or data associated with configuration operations. A signaling path 408 that corresponds to the signaling interface of the memory devices described above in reference to FIGS. 3 and 4 (i.e., having data and request interfaces, Data and Req) is used to transmit memory access requests and associated configuration information to the memory modules 421, and to transmit and receive write and read data associated with the memory access requests. Signaling path 408 may include one or more clock and/or strobe signal lines to convey timing signals (e.g., a reference clock signal or master clock signal) for timing the receipt of signals within the memory devices 425 and/or memory controller 407 and to establish synchronous operation within the memory devices 425. Alternatively, clocking information may be embedded in the request and/or data transmissions (e.g., with coding to ensure sufficient transition density) and recovered within individual components of the memory subsystem. For example, in one embodiment, each of the memory devices 425 includes clock recovery circuitry to recover a clock signal from one or more signals transmitted via signaling path 408.

Although memory modules 421 are depicted in FIG. 14, the memory devices 425 (and, optionally, associated or integrated SPD elements 427) may be mounted directly to a mother board or integrated into a multi-chip module along with the memory controller 407 and/or processor 401 to form, for example, a system-in-package (SIP) DRAM system. Also, the data path and request path (collectively, 408) coupled between the memory devices 425 (or memory modules) and the memory controller 407 may be implemented using virtually any signaling channel, including an electronic conduction path, an optical path or wireless signaling channel. Further, the processor 401, memory controller 407, and/or one or more of memory devices 425 may be combined on a single integrated circuit die in an alternative embodiment.

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, the interconnection between circuit elements or circuit blocks may be shown or described as multi-conductor or single conductor signal lines. Each of the multi-conductor signal lines may alternatively be single-conductor signal lines, and each of the single-conductor signal lines may alternatively be multi-conductor signal lines. Signals and signaling paths shown or described as being single-ended may also be differential, and vice-versa. Similarly, signals described or depicted as having active-high or active-low logic levels may have opposite logic levels in alternative embodiments. As another example, circuits described or depicted as including metal oxide semiconductor (MOS) transistors may alternatively be implemented using bipolar technology or any other technology in which a signal-controlled current flow may be achieved. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signal name>') is also used to indicate an active low signal. The term "coupled" is used herein to express a direct connection as well as a connection through one or more intervening circuits or structures. The term "exemplary" is used to express an example, not a preference or requirement.

Various aspects of the subject-matter described herein are set out, for example and without limitation, in the following numbered clauses:

1. A memory device comprising:
    a storage array; and
    a read data buffer coupled to the storage array via data lines and having control logic to load data conveyed on all the data lines into the read data buffer in response to assertion of a load signal in a first prefetch mode and to load data conveyed on an address-selected subset of the data lines into the read data buffer in response to assertion of the load signal in a second prefetch mode.
2. The memory device of clause 1 wherein the storage array comprises a set of sense amplifiers to store data retrieved from selected storage cells within the storage array and wherein the data lines are coupled between the read data buffer and the set of sense amplifiers.
3. The memory device of clause 2 further comprising column decoding circuitry to switchably connect all the data lines to respective sense amplifiers within the set of sense amplifiers in the first prefetch mode and to switchably connect the address-selected subset of the data lines to respective sense amplifiers within the set of sense amplifiers in the second prefetch mode.
4. The memory device of clause 3 wherein the column decoding circuitry comprises a multiplexing circuit coupled between the data lines and the set of sense amplifiers.
5. The memory device of clause 1 wherein the read data buffer includes a plurality of storage elements to store read data, and wherein the control logic includes multiplexer circuitry to switchably connect the address-selected subset of the data lines to a subset of the plurality of storage elements in the second prefetch mode.
6. The memory device of clause 5 wherein the plurality of storage elements are coupled to one another to form a first-in-first-out (FIFO) buffer, and wherein the subset of the plurality of storage elements includes storage elements that form an output node of the FIFO buffer.
7. The memory device of clause 1 further comprising a programmable register to store a value that establishes either the first prefetch mode or the second prefetch mode within the memory device.
8. A memory device comprising:
    a storage array;
    a bank of sense amplifiers coupled to receive data from an address-selected row of storage cells within the storage array;
    a plurality of data lines; and
    column decoding circuitry to switchably connect all the data lines to the bank of sense amplifiers in a first prefetch mode and to switchably connect fewer than all the data lines to the bank of sense amplifiers in a second prefetch mode.
9. The memory device of clause 8 wherein the fewer than all the data lines comprises not more than half the data lines in the second prefetch mode.
10. The memory device of clause 8 wherein the column decoding circuitry is coupled to receive a subprefetch address information and includes logic circuitry to switchably connect one of a plurality of different subsets of the data lines to the bank of sense amplifiers in accordance with the subprefetch address information.
11. The memory device of clause 8 further comprising a programmable register to store a value that establishes either the first prefetch mode or the second prefetch mode within the memory device.
12. A system comprising:
    a memory controller;
    a signaling path coupled to the memory controller; and
    a memory device coupled to the signaling path and having:
        a storage array, and
        a read data buffer coupled to the storage array via data lines and having control logic to load data conveyed on all the data lines into the read data buffer in response to assertion of a load signal in a first prefetch mode and to load data conveyed on an address-selected subset of the data lines into the read data buffer in response to assertion of the load signal in a second prefetch mode.
13. The system of clause 12 wherein the memory device comprises a programmable register to store a prefetch mode value in response to an instruction from the memory controller, the prefetch mode value establishing either the first prefetch mode or the second prefetch mode within the memory device.

14. A system comprising:
   a memory controller;
   a signaling path coupled to the memory controller; and
   a memory device coupled to the signaling path and having:
      a storage array,
      a bank of sense amplifiers coupled to receive data from an address-selected row of storage cells within the storage array,
      a plurality of data lines, and
      column decoding circuitry to switchably connect all the data lines to the bank of sense amplifiers in a first prefetch mode and to switchably connect fewer than all the data lines to the bank of sense amplifiers in a second prefetch mode.

15. The system of clause 14 wherein the memory device comprises a programmable register to store a prefetch mode value in response to an instruction from the memory controller, the prefetch mode value establishing either the first prefetch mode or the second prefetch mode within the memory device.

16. A method of operation within a memory device, the method comprising:
   retrieving data from a storage array;
   loading either a first portion of the data or a second portion of the data into a read data buffer according to whether a prefetch mode signal indicates a first prefetch mode or a second prefetch mode, the second portion of the data being smaller than the first portion of the data; and
   outputting the portion of the data loaded into the read data buffer from the memory device.

17. The method of clause 16 wherein loading the first portion of the data into the read data buffer comprises forming a signal path between sense amplifiers that contain the first portion of the data and a plurality of storage elements within the read data buffer, and wherein loading the second portion of the data comprises forming a signal path between an address-selected subset of the sense amplifiers and a subset of the plurality of storage elements.

18. The method of clause 16 wherein the read data buffer comprises a plurality of storage elements coupled to one another to form a first-in-first-out (FIFO) buffer, and wherein outputting the portion of the data loaded into the read data buffer comprises performing a first number of shift operations within the FIFO buffer to output the portion of the data when the prefetch mode signal indicates the first prefetch mode, and performing fewer than the first number of shift operations within the FIFO buffer to output the portion of the data when the prefetch mode signal indicates the second prefetch mode.

19. A method of operation within a memory device, the method comprising:
   switchably connecting either a plurality of data lines or a subset of the plurality of data lines between a bank of sense amplifiers and a read data buffer according to whether a prefetch mode signal is in a first state or a second state; and
   transferring data from the bank of sense amplifiers to the read data buffer via the data lines switchably connected therebetween.

20. The method of clause 19 further comprising, if the prefetch mode signal is in second state, switchably connecting either a first subset of the plurality of data lines or a second subset of the plurality of data lines between the bank of sense amplifiers and the read data buffer according to an address value.

21. Computer-readable media having information embodied therein that includes a description of an integrated-circuit memory device, the information including descriptions of:
   a storage array;
   data lines coupled to the storage array; and
   a read data buffer coupled to the storage array via the data lines and having control logic to load data conveyed on all the data lines into the read data buffer in response to assertion of a load signal in a first prefetch mode and to load data conveyed on an address-selected subset of the data lines into the read data buffer in response to assertion of the load signal in a second prefetch mode.

22. A memory device comprising:
   a storage array;
   a read data buffer coupled to the storage array;
   means for retrieving data from the storage array;
   means for loading either a first portion of the data or a second portion of the data into a read data buffer according to whether a prefetch mode signal indicates a first prefetch mode or a second prefetch mode, the second portion of the data being smaller than the first portion of the data; and
   means for outputting the portion of the data loaded into the read data buffer from the memory device.

23. A memory device comprising:
   a memory core having a plurality of storage resources; and
   a configuration circuit to store a first value that indicates a minimum number of cycles of a clock signal that are to transpire between successive accesses to any one of the storage resources.

24. The memory device of clause 23 further comprising a request logic circuit to store the first value within the configuration circuit in response to an instruction from an external device.

25. The memory device of clause 23 further comprising a clock input to receive the clock signal from an external source.

26. The memory device of clause 23 further comprising a request logic circuit to access not more than one of the storage resources during each successive interval framed by the indicated number of cycles of the clock signal if the first value is below a predetermined value, and to access more than one of the storage resources during each successive interval framed by the indicated number of cycles of the clock signal if the first value is above the predetermined value.

27. A method of operation within a synchronous memory device circuit having multiple storage resources, the method comprising:
   receiving a first value that indicates a minimum number of cycles of a clock signal that are to transpire between successive accesses to any one of the storage resources; and
   storing the first value within a configuration circuit of the synchronous memory device.

28. The method of clause 27 wherein a product of the first value and the period of the clock signal defines a core access interval, and wherein each of the storage resources may be accessed not more than once per core access interval.

29. The method of clause 27 wherein the first value indicates that at least N cycles of the clock signal are to transpire between successive accesses to any one of the storage resources, the method further comprising:
   receiving a first address that indicates a storage location within a first one of the storage resources; and if N is less than a threshold number, transferring data associated with the first address between a signaling interface and a storage buffer of the synchronous memory device during each of N cycles of the clock signal.

30. The method of clause 29 further comprising:
receiving a second address that indicates a storage location within a second one of the storage resources; and
if N is greater than or equal to the threshold number, transferring the data associated with the first address between the signaling interface and the storage buffer during each of X cycles of the clock signal, and transferring data associated with the second address between the signaling interface and the storage buffer during each of X cycles of the clock signal, X being less than N.

31. The method of clause 30 wherein X equals N divided by M, wherein M is an integer value greater than one.

32. The method of clause 30 wherein transferring data associated with the second address comprises transferring the data associated with the second address during a sequence of X cycles of the clock signal that immediately follow transferring the data associated with the first address.

33. A method of controlling a memory device having multiple storage resources, the method comprising:
determining a first value that indicates a number of cycles of a clock signal that are to transpire between successive accesses to any one of the storage resources; and
outputting the first value to the memory device; and
outputting an instruction to the memory device to instruct the memory device to store the first value within a configuration circuit of the memory device.

34. The method of clause 33 wherein the first value indicates that N cycles of the clock signal are to transpire between successive accesses to any one of the storage resources, the method further comprising instructing the memory device to output data associated with a first address during each of N cycles of the clock signal if N is less than a threshold number.

35. The method of clause 34 further comprising instructing the memory device to output data associated with the first address during each of X cycles of the clock signal and to output data associated with a second address during each of X cycles of the clock signal if N is greater than or equal to the threshold number, X being less than N 36. The method of clause 35 wherein X equals N divided by M, wherein M is an integer value greater than one.

37. The method of clause 35 wherein transferring data associated with the second address comprises transferring the data associated with the second address during a sequence of X cycles of the clock signal that immediately follow transferring the data associated with the first address.

38. A memory system comprising:
a memory device having a plurality of storage resources and a configuration circuit to store a first value that indicates a minimum number of cycles of a clock signal that are to transpire between successive accesses to any one of the storage resources; and
a memory controller to output the first value to the memory device and to output an instruction to the memory device to instruct the memory device to store the first value within the configuration circuit.

39. A synchronous memory device comprising:
a plurality of storage resources;
a configuration circuit; and
means for receiving a first value that indicates a minimum number of cycles of a clock signal that are to transpire between successive accesses to any one of the storage resources and for storing the first value in the configuration circuit.

40. Computer-readable media having information embodied therein that includes a description of an integrated-circuit memory device, the information including descriptions of:
a memory core having a plurality of storage resources; and
a configuration circuit to store a first value that indicates a minimum number of cycles of a clock signal that are to transpire between successive accesses to any one of the storage resources.

While the invention has been described with reference to specific embodiments thereof, it will be evident that various modifications and changes may be made thereto without departing from the broader spirit and scope of the invention. Accordingly, the specification and drawings are to be regarded in an illustrative rather than a restrictive sense.

What is claimed is:

1. An integrated-circuit memory device comprising:
a storage array;
a read data buffer coupled to the storage array via data lines and having control logic to load data conveyed on all the data lines into the read data buffer in response to assertion of a load signal in a first prefetch mode and, in a second prefetch mode, to select one of a plurality of subsets of the data lines in response to an address value and to load data conveyed on the address-selected subset of the data lines into the read data buffer in response to assertion of the load signal; and
wherein the storage array includes a set of sense amplifiers to store data retrieved from selected storage cells within the storage array and wherein the data lines are coupled between the read data buffer and the set of sense amplifiers.

2. The integrated-circuit memory device of claim 1 further comprising column decoding circuitry to switchably connect all the data lines to respective sense amplifiers within the set of sense amplifiers in the first prefetch mode and to switchably connect the address-selected subset of the data lines to respective sense amplifiers within the set of sense amplifiers in the second prefetch mode.

3. The integrated-circuit memory device of claim 1 wherein the read data buffer includes a plurality of storage elements to store read data, and wherein the control logic includes multiplexer circuitry to switchably connect the address-selected subset of the data lines to a subset of the plurality of storage elements in the second prefetch mode.

4. The integrated-circuit memory device of claim 1 further comprising a programmable register to store a value that establishes either the first prefetch mode or the second prefetch mode within the integrated-circuit memory device.

5. A system comprising:
a memory controller;
a signaling path coupled to the memory controller; and
an integrated-circuit memory device coupled to the signaling path and having:
a storage array,
a read data buffer coupled to the storage array via data lines and having control logic to load data conveyed on all the data lines into the read data buffer in response to assertion of a load signal in a first prefetch mode and, in a second prefetch mode, to select one of a plurality of subsets of the data lines in response to an address value and to load data conveyed on an address-selected subset of the data lines into the read data buffer in response to assertion of the load signal, and wherein the storage array includes a set of sense amplifiers to store data retrieved from selected storage cells within the storage array and wherein the data lines are coupled between the read data buffer and the set of sense amplifiers.

6. The system of claim 5 wherein the integrated-circuit memory device comprises a programmable register to store a prefetch mode value in response to an instruction from the memory controller, the prefetch mode value establishing either the first prefetch mode or the second prefetch mode within the integrated-circuit memory device.

7. A method of operation within an integrated-circuit memory device having a storage array, a read data buffer and data lines to convey data from the storage array to the read data buffer, the method comprising:
   in a first prefetch mode, loading data conveyed on all the data lines into the read data buffer in response to assertion of a load signal;
   in a second prefetch mode, selecting one of a plurality of subsets of the data lines in response to an address value and loading data conveyed on the address-selected subset of the data lines into the read data buffer in response to assertion of the load signal; and
   outputting the data loaded into the read data buffer from the memory device.

8. Computer-readable storage media comprising:
   information that includes a description of an integrated circuit memory device, the information including descriptions of:
      a storage array;
      data lines coupled to the storage array; and
      a read data buffer coupled to the storage array via the data lines and having control logic to load data conveyed on all the data lines into the read data buffer in response to assertion of a load signal in a first prefetch mode and, in a second prefetch mode, to select one of a plurality of subsets of the data lines in response to an address value and to load data conveyed on the address-selected subset of the data lines into the read data buffer in response to assertion of the load signal; and
   wherein the storage array includes a set of sense amplifiers to store data retrieved from selected storage cells within the storage array and wherein the data lines are coupled between the read data buffer and the set of sense amplifiers.

9. An integrated-circuit memory device comprising:
   a storage array;
   a read data buffer coupled to the storage array;
   data lines to convey data from the storage array to the read data buffer;
   means for loading data conveyed on all the data lines into the read data buffer in response to assertion of a load signal in a first prefetch mode;
   means for selecting one of a plurality of subsets of the data lines in response to an address value and loading data conveyed on the address-selected subset of the data lines into the read data buffer in response to assertion of the load signal in a second prefetch mode; and
   means for outputting the data loaded into the read data buffer from the integrated-circuit memory device.

* * * * *